(12) United States Patent
Yu et al.

(10) Patent No.: US 10,269,620 B2
(45) Date of Patent: Apr. 23, 2019

(54) MULTI-TIER MEMORY DEVICE WITH THROUGH-STACK PERIPHERAL CONTACT VIA STRUCTURES AND METHOD OF MAKING THEREOF

(71) Applicant: SANDISK TECHNOLOGIES LLC, Plano, TX (US)

(72) Inventors: Jixin Yu, Milpitas, CA (US); Zhenyu Lu, Milpitas, CA (US); Hiroyuki Ogawa, Yokkaichi (JP); Daxin Mao, Cupertino, CA (US); Kensuke Yamaguchi, Yokkaichi (JP); Sung Tae Lee, Yokkaichi (JP); Yao-sheng Lee, Tampa, FL (US); Johann Alsmeier, San Jose, CA (US)

(73) Assignee: SANDISK TECHNOLOGIES LLC, Addison, TX (US)

( * ) Notice: Subject to any disclaimer, the term of this patent is extended or adjusted under 35 U.S.C. 154(b) by 7 days.

(21) Appl. No.: 15/274,451

(22) Filed: Sep. 23, 2016

(65) Prior Publication Data

US 2017/0236746 A1 Aug. 17, 2017

Related U.S. Application Data

(60) Provisional application No. 62/295,649, filed on Feb. 16, 2016.

(51) Int. Cl.
*H01L 27/115* (2017.01)
*H01L 21/768* (2006.01)
(Continued)

(52) U.S. Cl.
CPC .... *H01L 21/76805* (2013.01); *G11C 16/0483* (2013.01); *G11C 16/08* (2013.01);
(Continued)

(58) Field of Classification Search
None
See application file for complete search history.

(56) References Cited

U.S. PATENT DOCUMENTS

| 5,915,167 A | 6/1999 | Leedy |
| 8,884,357 B2 | 11/2014 | Wang et al. |

(Continued)

OTHER PUBLICATIONS

U.S. Appl. No. 14/739,284, filed Jun. 15, 2015, SanDisk Technologies Inc.

(Continued)

*Primary Examiner* — Steven H Loke
*Assistant Examiner* — Scott Stowe
(74) *Attorney, Agent, or Firm* — The Marbury Law Group PLLC

(57) ABSTRACT

Contacts to peripheral devices extending through multiple tier structures of a three-dimensional memory device can be formed with minimal additional processing steps. First peripheral via cavities through a first tier structure can be formed concurrently with formation of first memory openings. Sacrificial via fill structures can be formed in the first peripheral via cavities concurrently with formation of sacrificial memory opening fill structures that are formed in the first memory openings. Second peripheral via cavities through a second tier structure can be formed concurrently with formation of word line contact via cavities that extend to top surfaces of electrically conductive layers in the first and second tier structures. After removal of the sacrificial via fill structures, the first and second peripheral via cavities can be filled with a conductive material to form peripheral contact via structures concurrently with formation of word line contact via structures.

15 Claims, 24 Drawing Sheets

(51) Int. Cl.

| | | |
|---|---|---|
| *G11C 16/04* | (2006.01) | |
| *G11C 16/08* | (2006.01) | |
| *G11C 16/24* | (2006.01) | |
| *G11C 16/26* | (2006.01) | |
| *H01L 23/522* | (2006.01) | |
| *H01L 23/528* | (2006.01) | |
| *H01L 27/11524* | (2017.01) | |
| *H01L 27/11529* | (2017.01) | |
| *H01L 27/11556* | (2017.01) | |
| *H01L 27/1157* | (2017.01) | |
| *H01L 27/11573* | (2017.01) | |
| *H01L 27/11582* | (2017.01) | |
| *H01L 27/11575* | (2017.01) | |
| *H01L 27/11548* | (2017.01) | |

(52) U.S. Cl.
CPC .............. *G11C 16/24* (2013.01); *G11C 16/26* (2013.01); *H01L 21/76877* (2013.01); *H01L 23/5226* (2013.01); *H01L 23/5283* (2013.01); *H01L 27/1157* (2013.01); *H01L 27/11524* (2013.01); *H01L 27/11529* (2013.01); *H01L 27/11556* (2013.01); *H01L 27/11573* (2013.01); *H01L 27/11575* (2013.01); *H01L 27/11582* (2013.01); *H01L 27/11548* (2013.01)

(56) References Cited

U.S. PATENT DOCUMENTS

| | | |
|---|---|---|
| 8,946,023 B2 | 2/2015 | Makala et al. |
| 9,230,987 B2 | 1/2016 | Pachamuthu et al. |
| 9,236,392 B1 | 1/2016 | Izumi et al. |
| 9,449,982 B2 | 9/2016 | Lu et al. |
| 2011/0312174 A1 | 12/2011 | Lee et al. |
| 2011/0316072 A1 | 12/2011 | Lee |
| 2012/0168858 A1 | 7/2012 | Hong |
| 2013/0056816 A1 | 3/2013 | Iwase et al. |
| 2014/0061748 A1 | 3/2014 | Lee |
| 2015/0236038 A1 | 8/2015 | Pachamuthu et al. |
| 2015/0372000 A1 | 12/2015 | Jee et al. |
| 2016/0204117 A1 | 7/2016 | Liu et al. |
| 2017/0077113 A1* | 3/2017 | Nomachi .......... H01L 27/11556 |

OTHER PUBLICATIONS

U.S. Appl. No. 14/739,354, filed Jun. 15, 2015, SanDisk Technologies Inc.
U.S. Appl. No. 14/834,830, filed Aug. 25, 2015, SanDisk Technologies Inc.
U.S. Appl. No. 14/834,943, filed Aug. 25, 2015, SanDisk Technologies Inc.
U.S. Appl. No. 14/862,916, filed Sep. 23, 2015, SanDisk Technologies Inc.
U.S. Appl. No. 14/883,966, filed Oct. 15, 2015, SanDisk Technologies Inc.
U.S. Appl. No. 15/015,190, filed Feb. 4, 2016, SanDisk Technologies Inc.
U.S. Appl. No. 15/186,768, filed Jun. 20, 2016, SanDisk Technologies Inc.
International Search Report and Written Opinion of the International Searching Authority for International Patent Application No. PCT/US2017/017403, dated Jul. 20, 2017, 22 pages.
International Preliminary Report on Patentability from the International Bureau for International Patent Application No. PCT/US2017/017403, dated Aug. 30, 2018, 14 pages.

* cited by examiner

MULTI-TIER MEMORY DEVICE WITH THROUGH-STACK PERIPHERAL CONTACT VIA STRUCTURES AND METHOD OF MAKING THEREOF

RELATED APPLICATIONS

The present application claims the benefit of priority from U.S. Provisional Application No. 62/295,649 filed on Feb. 16, 2016, the entire contents of which are incorporated herein by reference.

FIELD

The present disclosure relates generally to the field of semiconductor devices and specifically to three-dimensional non-volatile memory devices, such as vertical NAND strings and other three-dimensional devices, and methods of making the same.

BACKGROUND

Recently, ultra high density storage devices have been proposed using a three-dimensional (3D) stacked memory stack structure sometimes referred to as Bit Cost Scalable (BiCS) architecture. For example, a 3D NAND stacked memory device can be formed from an array of alternating conductive and dielectric layers. A memory opening is formed through the layers to define many memory layers simultaneously. A NAND string is then formed by filling the memory opening with appropriate materials. A straight NAND string extends in one memory opening, while a pipe- or U-shaped NAND string (p-BiCS) includes a pair of vertical columns of memory cells. Control gates of the memory cells may be provided by the conductive layers.

SUMMARY

According to an aspect of the present disclosure, a method of forming a semiconductor structure is provided. Peripheral devices are formed on a semiconductor substrate. A first tier structure including a first active alternating stack and a first peripheral alternating stack is formed over the semiconductor substrate. At least the first peripheral alternating stack overlies the peripheral devices, and each of the first active alternating stack and the first peripheral alternating stack comprises an alternating stack of first insulating layers and first spacer material layers patterned to provide respective first stepped terraces. First peripheral via cavities are formed through the first peripheral alternating stack. The first peripheral via cavities are filled with sacrificial via fill structures. A second tier structure including a second active alternating stack and a second peripheral alternating stack over the first tier structure. Each of the second active alternating stack and the second peripheral alternating stack comprises an alternating stack of second insulating layers and second spacer material layers patterned to provide respective second stepped terraces, the second active alternating stack overlies the first active alternating stack, and the second peripheral alternating stack overlies the first peripheral alternating stack. Replacing portions of the first and second spacer material layers in the first and second active alternating stacks with electrically conductive layers. Concurrently forming second peripheral via cavities extending to the peripheral via fill structures through second peripheral alternating stack and word line contact via cavities extending to the electrically conductive layers in first and second active alternating stacks.

According to another aspect of the present disclosure, a three-dimensional memory device is provided, which comprises: peripheral devices on a semiconductor substrate; a first tier structure including a first active alternating stack and a first peripheral alternating stack and located over the semiconductor substrate, wherein at least the first peripheral alternating stack overlies the peripheral devices, the first active alternating stack comprises an alternating sequence of first electrically conductive layers and first portions of first insulating layers, and the first peripheral alternating stack comprises an alternating sequence of first spacer material layers and second portions of the first insulating layers; a second tier structure including a second active alternating stack and a second peripheral alternating stack and located over the first tier structure, wherein the second active alternating stack comprises an alternating sequence of second electrically conductive layers and first portions of second insulating layers, and the second peripheral alternating stack comprises an alternating sequence of second spacer material layers and second portions of the second insulating layers; memory stack structures extending through the first active alternating stack and the second active alternating stack; word line contact via structures vertically extending to a top surface of the electrically conductive layers; and peripheral via structures extending through the first and second peripheral alternating stacks and contacting components of the peripheral devices.

According to another embodiment of the present disclosure, a method of forming a semiconductor structure comprises forming peripheral devices on a semiconductor substrate and forming a first active alternating stack and a first peripheral alternating stack over the semiconductor substrate. At least the first peripheral alternating stack overlies the peripheral devices, and each of the first active alternating stack and the first peripheral alternating stack comprises an alternating stack of first insulating layers and first spacer material layers patterned to provide respective first stepped terraces. The method further comprises forming memory openings in the first active alternating stack, forming memory stack structures in the memory openings in the first active alternating stack, such that there are no memory stack structures located in the first peripheral alternating stack, and replacing the first spacer material layers in the first active alternating stack with first electrically conductive layers without replacing the first spacer material layers in the first peripheral stack with the electrically conductive layers. The first active alternating stack of first insulating layers and first spacer material layers is patterned using a mask which exposes only a region of the respective first stepped terraces on two opposing sides of the first active alternating stack facing a portion of the peripheral devices which comprise word line decoder circuitry, and no stepped terraces are formed on additional sides of the first active alternating stack facing a portion of the peripheral devices which comprise bit line decoder circuitry.

DETAILED DESCRIPTION

Figure 1:
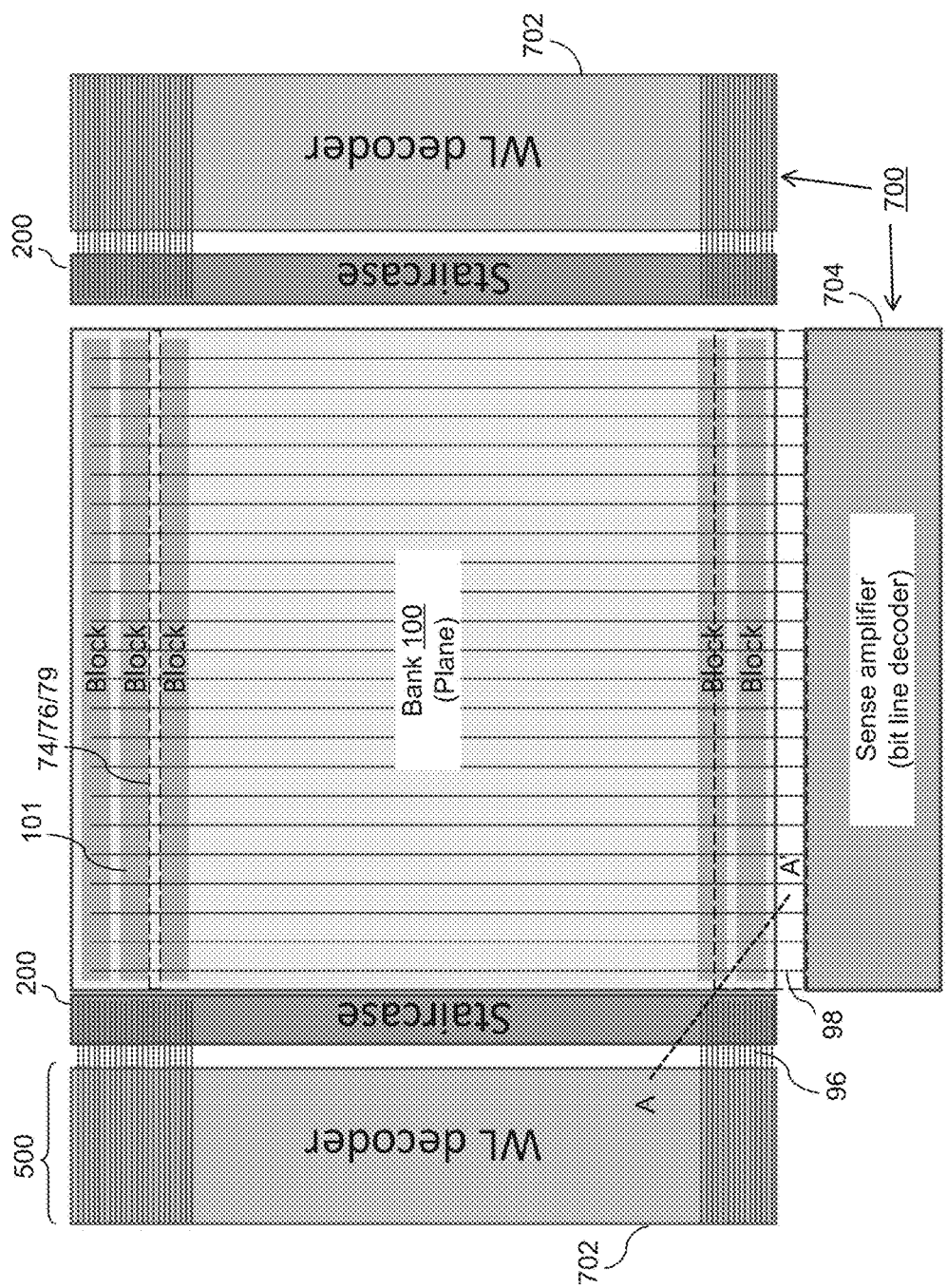
FIG. 1 is a schematic top layout view of a three-dimensional (3D) NAND chip in which the word line decoder circuitry and the bit line decoder circuitry are located in a peripheral region that is separate from the memory array region.

As discussed above, the present disclosure is directed to three-dimensional non-volatile memory devices, such as vertical NAND strings and other three-dimensional devices, and methods of making the same, the various aspects of which are described below. The embodiments of the disclosure can be employed to form various semiconductor devices such as three-dimensional monolithic memory array devices comprising a plurality of NAND memory strings. The drawings are not drawn to scale. Multiple instances of an element may be duplicated where a single instance of the element is illustrated, unless absence of duplication of elements is expressly described or clearly indicated otherwise.

Ordinals such as "first," "second," and "third" are employed merely to identify similar elements, and different ordinals may be employed across the specification and the claims of the instant disclosure. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, an "in-process" structure or a "transient" structure refers to a structure that is subsequently modified.

As used herein, any two or more measurable quantities are "substantially the same" if each of the two or more measurable quantities do not deviate from the average of the two or more measurable quantities by more than 2.5% of the average of the two or more measurable quantities. For example, a first lateral distance is substantially the same as a second lateral distance if the first lateral distance and the second lateral distance do not deviate from the average of the first lateral distance and the second lateral distance by more than 2.5% of the average of the first lateral distance and the second lateral distance.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, and/or may have one or more layer thereupon, thereabove, and/or therebelow.

As used herein, a "memory level" or a "memory array level" refers to the level corresponding to a general region between a first horizontal plane (i.e., a plane parallel to the top surface of the substrate) including topmost surfaces of an array of memory elements and a second horizontal plane including bottommost surfaces of the array of memory elements. As used herein, a "through-peripheral-stack" element refers to an element that vertically extends through one or more peripheral alternating stacks in one or more tier structures.

As used herein, a "semiconductor material" refers to a material having electrical conductivity in the range from $1.0 \times 10^{-6}$ S/cm to $1.0 \times 10^{5}$ S/cm, and is capable of producing a doped material having electrical conductivity in a range from 1.0 S/cm to $1.0 \times 10^{5}$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^{5}$ S/cm. As used herein, an "insulating material" or a "dielectric material" refers to a material having electrical conductivity less than $1.0 \times 10^{-6}$ S/cm. All measurements for electrical conductivities are made at the standard condition.

A monolithic three dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three Dimensional Structure Memory." The substrates may be thinned or removed from the memory levels before bonding, but as the memory levels are initially formed over separate substrates, such memories are not true monolithic three dimensional memory arrays. The substrate may include integrated circuits fabricated thereon, such as driver circuits for a memory device The various three dimensional memory devices of the present disclosure include a monolithic three-dimensional NAND string memory device, and can be fabricated employing the various embodiments described herein. The monolithic three dimensional NAND string is located in a monolithic, three dimensional array of NAND strings located over the substrate. At least one memory cell in the first device level of the three dimensional array of NAND strings is located over another memory cell in the second device level of the three dimensional array of NAND strings.

Referring to FIG. 1, a layout of a three-dimensional (3D) NAND chip is illustrated in which the word line decoder circuitry 702 and the bit line decoder circuitry 704 are located in peripheral device region(s) 700 are separate from the memory array region 100 containing memory cells. Region 100 can also be referred to as a 3D NAND bank, plane or a page) which is located in a rectangular area. A plurality of NAND strings are arranged in NAND memory blocks 101 separated by trenches 79 filled with an insulating spacer 74 and optional backside contact via structure 76. Word line decoder circuitry 702 (which is also referred to as a row decoder circuitry or a "ROWDEC circuitry") controls the voltages applied to the word lines of the memory array region (i.e., the 3D NAND bank) 100. Staircase regions 200 can be provided adjacent to the memory array region 100 so that vertical contact via structures to the word lines can be formed in the staircase areas. In one embodiment of the present disclosure, the staircase regions 200 are provided only on the word line decoder circuitry 702 sides of the memory array region 100 to permit metal lines 96 (schematically illustrated as horizontal lines between pairs of a staircase region 200 and a word line decoder circuitry 702) to provide electrical connection between the word lines extending from the memory array region 100 into the staircase region 200 and the word line decoder circuitry 702. A sense amplifier circuitry 704 (which is also referred to as a bit line decoder circuitry or a "page buffer" circuitry) controls voltage applied to the bit lines 98 (which are schematically illustrated as vertical lines extending over the memory array region and to the sense amplifier circuitry) controls voltages applied to the bit lines, detects the status of individual memory cells within the memory array region (for example, during a read operation), and latches the status of the individual memory cells. Optionally, the sense amplifier circuitry 704 may also extend under the memory array region 100, as shown by the dashed lines. Preferably, there are no dummy staircase regions on the sense amplifier circuitry 704 side of the memory array region 100. The word line decoder circuitry 702 can be embodied as two blocks of peripheral device regions 700 located adjacent to the staircase regions 200, and the sense amplifier circuitry 704 can be located in an area that is 90 degrees rotated from one of the word line decoder circuitry areas to enable connection with all of the bit lines.

The areas of the word line decoder circuitry and the sense amplifier circuitry are not negligible as a fraction of the entire area of the semiconductor chip. The total areas of the word line decoder circuitry and the sense amplifier circuitry can easily exceed 20% of the total chip area, and may exceed 30% of the total chip area for some 3D NAND memory devices. The total areas of the word line decoder circuitry and the sense amplifier circuitry as a fraction of the total area of a 3D NAND memory chip is expected to increase even further as the total number of word lines (as implemented as electrically conductive layers in a vertical stack) increases in a high density 3D NAND memory device. Thus, it is desirable to reduce the fraction of the areas that are employed for the word line decoder circuitry and the sense amplifier circuitry over the total chip area in a 3D NAND memory device.

Figure 2A:
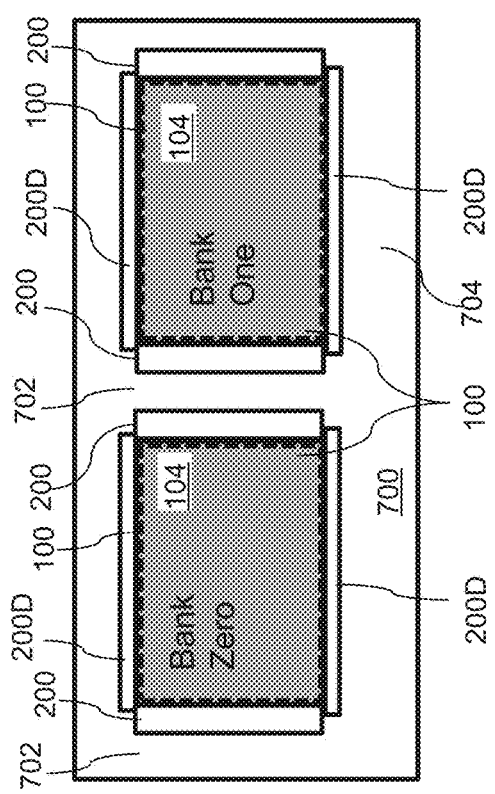
FIG. 2A is a schematic top layout view of a prior art mask for forming staircase regions.

FIG. 2A is a schematic top layout view of a prior art mask 104 (e.g., photoresist masking layer or hardmask masking layer) for forming staircase regions. The mask 104 covers only the 3D NAND banks (e.g., the memory array regions 100), which are labeled "bank zero" and "bank one". The entire peripheral region 700 and the staircase regions 200 are exposed by the mask 104. During the etching of the staircase regions (described in more detail below) using the mask 104, the staircase regions 200 are formed on two opposite sides of the memory array regions 100 facing the word line decoder circuitry 702. However, during the same etching steps, additional "dummy" staircase regions 200D are formed on the remaining two sides of the memory array regions 100 facing the bit line decoder circuitry (e.g., sense amplifier circuitry) 704, since the entire peripheral region 700 is exposed by the mask 104. The dummy staircase regions 200D are undesirable because they are not used in the device and simply take up valuable chip space.

The embodiments of the present disclosure can reduce the total chip area and reduce the manufacturing cost and complexity by forming smaller staircase regions by eliminating the dummy staircase regions 200D in the peripheral region 700 on the sense amplifier circuitry 704 side of the memory array region 100 and eliminating separate lithography and etching steps used to form word line contact via cavities.

Figure 2B:
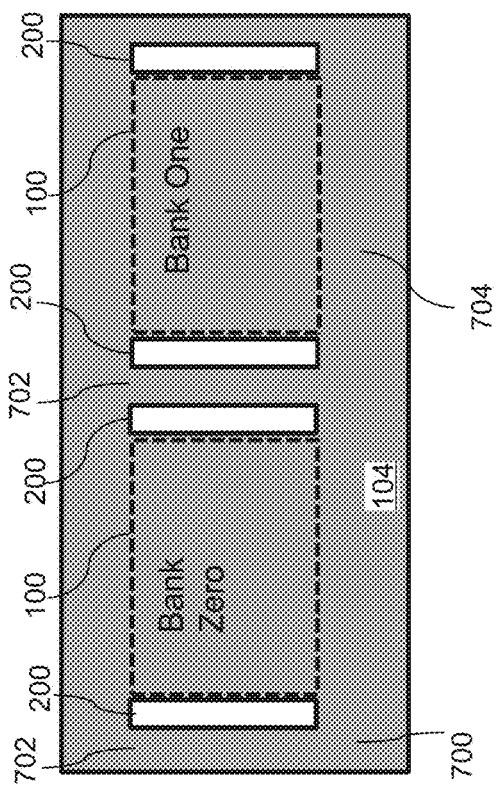
FIG. 2B is a schematic top layout view of a mask for forming staircase regions according to embodiments of the present disclosure.

FIG. 2B is a schematic top layout view of a mask 104 (e.g., photoresist mask) for forming staircase regions of the embodiments of the present disclosure. The mask 104 covers not only the 3D NAND banks (e.g., the memory array regions 100) but also the entire peripheral region 700. The mask 104 contains openings only over the staircase regions 200 which are exposed by the mask 104. During the etching of the staircase using the mask 104, only the staircase regions 200 exposed in mask 104 openings are formed on two opposite sides of the memory array regions 100 facing the word line decoder circuitry 702. No additional staircase regions (i.e., no dummy staircase regions 200D) are formed on the remaining two sides of the memory array regions 100 facing the bit line decoder circuitry (e.g., sense amplifier circuitry) 704, since the entire peripheral region 700 is covered by the mask 104. In other words, for a rectangular 3D NAND bank (memory array region) 100, staircase regions are formed on only two opposing sides of the 3D NAND bank. The omission of the dummy staircase regions 200D increases the amount of chip space available for memory and peripheral devices.

Figure 2C:
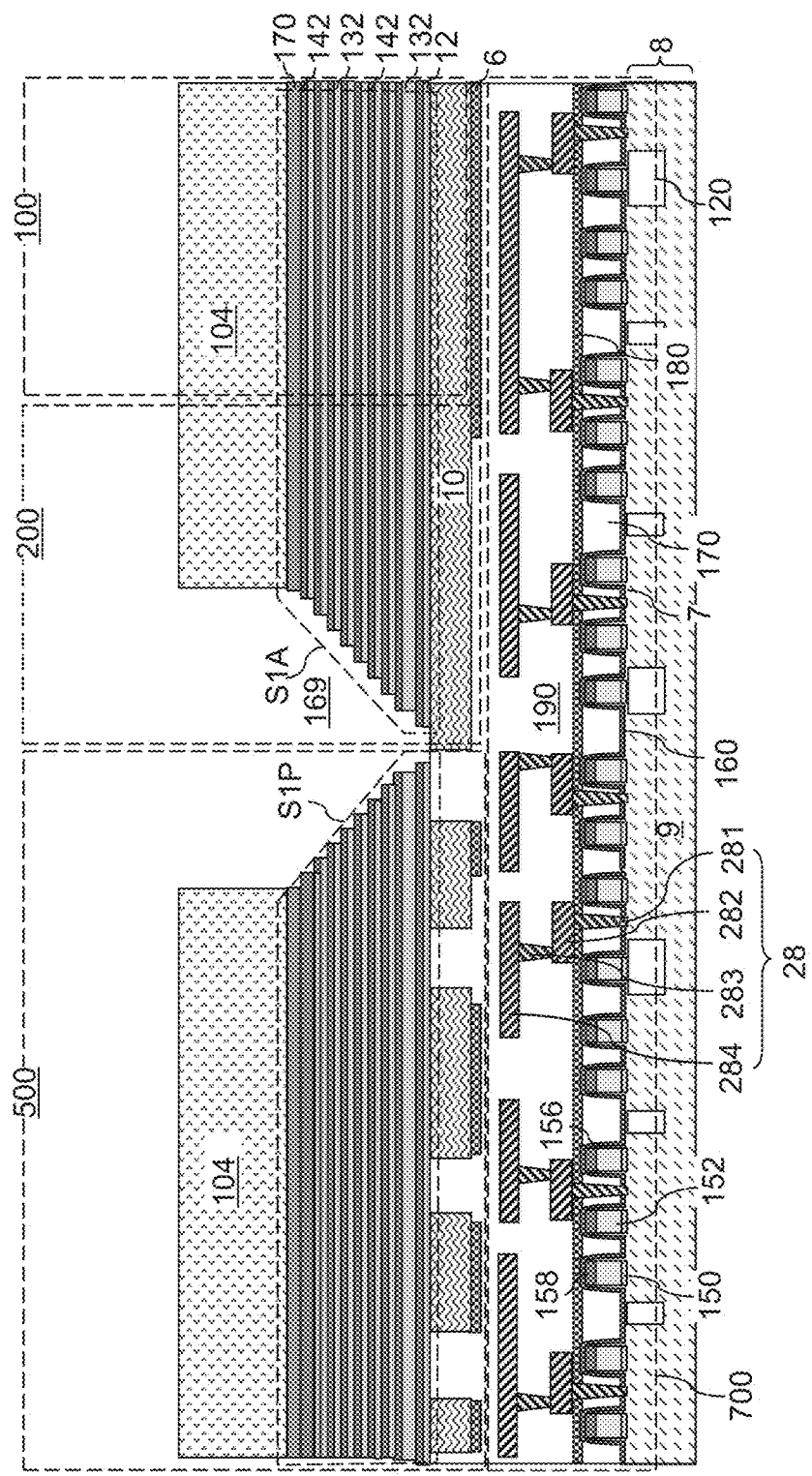
FIG. 2C is a vertical cross-sectional view of a first exemplary device structure after formation and patterning of a first alternating stack of first insulating layers and first spacer material layers using the mask of FIG. 2B, according to a first embodiment of the present disclosure.

Referring to FIG. 2C, a first exemplary structure according to a first embodiment of the present disclosure is illustrated. The first exemplary structure includes a substrate 8, which can include a substrate semiconductor layer 9 at least in an upper portion thereof. Various semiconductor devices can be formed on, or over, the substrate semiconductor layer 9 employing methods known in the art. The substrate semiconductor layer 9 is a semiconductor material layer, and can include at least one elemental semiconductor material, at least one III-V compound semiconductor material, at least one II-VI compound semiconductor material, at least one organic semiconductor material, or other semiconductor materials known in the art. The semiconductor substrate 8 has a major surface 7, which can be, for example, a topmost surface of the substrate semiconductor layer 9. The major surface 7 can be a semiconductor surface. In one embodiment, the major surface 7 can be a single crystalline semiconductor surface. In one embodiment, the substrate semiconductor layer 9 is a silicon wafer containing doped wells.

Shallow trench isolation structures 120 can be formed in an upper portion of the substrate semiconductor layer 9 to provide electrical isolation among the semiconductor devices. The semiconductor devices can include, for example, field effect transistors including respective source regions (which are doped surface portions of the substrate semiconductor layer 9), drain regions (which are additional doped surface portions of the substrate semiconductor layer 9), channel regions (which are portions of the substrate semiconductor layer 9) located between a pair of a source region and a drain region, and gate structures (150, 152, 158). Each gate structure (150, 152, 158) can include a gate dielectric 150, a gate electrode 152, and a gate cap dielectric 158. A gate spacer 156 can be provided around each gate structure (150, 152, 158). The field effect transistors may be arranged in a CMOS configuration.

The semiconductor devices can include any semiconductor circuitry to support operation of a memory structure to be subsequently formed, which is typically referred to as a driver circuitry, which is also known as peripheral circuitry. As used herein, a peripheral circuitry refers to any, each, or all, of word line decoder circuitry, word line switching circuitry, bit line decoder circuitry, bit line sensing and/or switching circuitry, power supply/distribution circuitry, data buffer and/or latch, or any other semiconductor circuitry that can be implemented outside a memory array structure for a memory device. For example, the semiconductor devices can include word line switching devices for electrically biasing word lines of three-dimensional memory structures to be subsequently formed and sense amplifier devices located under the staircase regions 200 and/or under the memory array region 100.

At least one dielectric layer is formed over the semiconductor devices, which is herein referred to as at least one lower level dielectric layer (160, 170, 180, 190). The at least one lower level dielectric layer (160, 170, 180, 190) can include, for example, an optional dielectric liner 160 such as a silicon nitride liner that blocks diffusion of mobile ions and/or applies appropriate stress to underlying structures, a planarization dielectric layer 170 that is employed to provide a planar surface that is coplanar with the topmost surface of the dielectric liner 160 or the topmost surfaces of the gate structures (150, 152, 158), an optional planar liner 180, and at least one lower level interconnect dielectric layer 190 that collectively functions as a matrix for lower level metal interconnect structures 28 that provide electrical wiring among the various nodes of the semiconductor devices and landing pads for through-peripheral-stack via structures to be subsequently formed.

The lower level metal interconnect structures 28 are embedded in at least lower level dielectric layer (160, 170, 180, 190), and are formed over the peripheral devices. The lower level metal interconnect structures 28 can include various device contact via structures 281 (e.g., source and drain electrodes which contact the respective source and drain nodes of the device or gate electrode contacts), lower level metal lines 282, lower level via structures 283, and lower level topmost metal structures 284 that are configured to function as landing pads for through-peripheral-stack via structures to be subsequently formed.

The region of the semiconductor devices and the combination of the at least one lower level dielectric layer (160, 170, 180, 190) and the lower level metal interconnect structures 28 is herein referred to as a peripheral device region 700, which can include an area underneath the memory array region 100 to be subsequently formed and includes peripheral devices for the memory array region 100. The lower level metal interconnect structures 28 are embedded in the at least one lower level dielectric layer (160, 170, 180, 190). In one embodiment, the topmost surfaces of the lower level topmost metal structures 284 may be located at or below a horizontal plane including the topmost surface of the at least one lower level dielectric layer (160, 170, 180, 190).

The lower level metal interconnect structures 28 can be electrically shorted to nodes (e.g., source regions, drain regions, or gate electrodes 152) of the semiconductor devices (e.g., CMOS devices) on the substrate semiconductor layer 9, and are located at the level of the at least one lower level dielectric layer (160, 170, 180, 190). In one embodiment, the pattern of the lower level metal interconnect structures 28 can be selected such that the lower level topmost metal structures 284, which are a subset of the lower level metal interconnect structures 28 that is located at the topmost level of the lower level metal interconnect structures 28, can provide landing pad structures within a through-peripheral-stack via region 500. The through-peripheral-stack via region 500 is a region in which through-peripheral-stack via structures that extend vertically through a memory-level assembly are subsequently formed. The first exemplary semiconductor structure can further include a memory array region 100 in which a memory array is subsequently formed, and a word line contact via region 200 (i.e., the staircase region) in which word line contact via structures are subsequently formed.

An optional planar material layer 6 and a planar semiconductor material layer 10 can be formed over the peripheral device region 700. In one embodiment, an upper portion of the at least one lower level dielectric layer (160, 170, 180, 190) may be recessed in the memory array region 100, and the optional planar material layer 6 and the planar semiconductor material layer 10 may be formed in the recessed region of the at least one lower level dielectric layer (160, 170, 180, 190). In another embodiment, the optional planar material layer 6 and the planar semiconductor material layer 10 may be deposited as planar material layers over the at least one lower level dielectric layer (160, 170, 180, 190), and a portion of the optional planar material layer 6 and the planar semiconductor material layer 10 may be removed from the through-peripheral-stack via region 500. The opening in the optional planar material layer 6 and the planar semiconductor material layer 10 within the area of the through-peripheral-stack via region 500 can be filled with a dielectric material (such as undoped silicate glass (e.g., silicon oxide) or doped silicate glass), which can be added to, and incorporated into, the at least one lower level dielectric layer (160, 170, 180, 190).

The optional planar material layer 6 includes a conductive material such as a metal or a heavily doped semiconductor material. The optional planar material layer 6, for example, may include a tungsten layer having a thickness in a range from 3 nm to 100 nm, although lesser and greater thicknesses can also be employed. A metal nitride layer (not shown) may be provided as a diffusion barrier layer on top of the planar material layer 6. The optional planar material layer 6 may function as a special source line in the completed device. Alternatively, the optional planar material layer 6 may comprise an etch stop layer and may comprise any suitable conductive, semiconductor or insulating layer.

The optional planar semiconductor material layer 10 can be formed over the at least one lower level dielectric layer (160, 170, 180, 190) and above the level of the peripheral devices. The planar semiconductor material layer 10 includes a semiconductor material, which can include at least one elemental semiconductor material, at least one III-V compound semiconductor material, at least one II-VI compound semiconductor material, at least one organic semiconductor material, and/or other semiconductor materials known in the art. In one embodiment, the planar semiconductor material layer 10 can include a polycrystalline semiconductor material (such as polysilicon), or an amorphous semiconductor material (such as amorphous silicon) that is converted into a polycrystalline semiconductor material in a subsequent processing step (such as an anneal step). The planar semiconductor material layer 10 can be formed directly above a subset of the semiconductor devices on the substrate semiconductor layer 9 (e.g., silicon wafer). As used herein, a first element is located "directly above" a second element if the first element is located above a horizontal plane including a topmost surface of the second element and an area of the first element and an area of the second element has an areal overlap in a plan view (i.e., along a vertical plane or direction perpendicular to the top surface of the substrate semiconductor layer 9). In one embodiment, the planar semiconductor material layer 10 or portions thereof can be doped with electrical dopants, which may be p-type dopants or n-type dopants. The conductivity type of the dopants in the planar semiconductor material layer 10 is herein referred to as a first conductivity type.

A dielectric pad layer 12 can be formed on the top surface of the planar semiconductor material layer 10. An alternating stack of first material layers and second material layers is subsequently formed. Each first material layer can include a first material, and each second material layer can include a second material that is different from the first material. In case at least another alternating stack of material layers is subsequently formed over the alternating stack of the first material layers and the second material layers, the alternating stack is herein referred to as a first-tier alternating stack. The level of the first-tier alternating stack is herein referred to as a first-tier level, and the level of the alternating stack to be subsequently formed immediately above the first-tier level is herein referred to as a second-tier level, etc.

The first-tier alternating stack can include first insulting layers 132 as the first material layers, and first spacer material layers as the second material layers. In one embodiment, the first spacer material layers can be sacrificial material layers that are subsequently replaced with electrically conductive layers. In another embodiment, the first spacer material layers can be electrically conductive layers that are not subsequently replaced with other layers. While the present disclosure is described employing embodiments in which sacrificial material layers are replaced with electrically conductive layers, embodiments in which the spacer material layers are formed as electrically conductive layers (thereby obviating the need to perform replacement processes) are expressly contemplated herein.

In one embodiment, the first material layers and the second material layers can be first insulating layers 132 and first sacrificial material layers 142, respectively. In one embodiment, each first insulating layer 132 can include a first insulating material, and each first sacrificial material layer 142 can include a first sacrificial material. An alternating plurality of first insulating layers 132 and first sacrificial material layers 142 is formed over the planar semiconductor material layer 10. As used herein, a "sacrificial material" refers to a material that is removed during a subsequent processing step.

As used herein, an alternating stack of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness thereamongst, or may have different thicknesses. The second elements may have the same thickness thereamongst, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

The first-tier alternating stack (132, 142) can include first insulating layers 132 composed of the first material, and first sacrificial material layers 142 composed of the second material, which is different from the first material. The first material of the first insulating layers 132 can be at least one insulating material. Insulating materials that can be employed for the first insulating layers 132 include, but are not limited to silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the first insulating layers 132 can be silicon oxide.

The second material of the first sacrificial material layers 142 is a sacrificial material that can be removed selective to the first material of the first insulating layers 132. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The first sacrificial material layers 142 may comprise an insulating material, a semiconductor material, or a conductive material. The second material of the first sacrificial material layers 142 can be subsequently replaced with electrically conductive electrodes which can function, for example, as control gate electrodes of a vertical NAND device. In one embodiment, the first sacrificial material layers 142 can be material layers that comprise silicon nitride.

In one embodiment, the first insulating layers 132 can include silicon oxide, and sacrificial material layers can include silicon nitride sacrificial material layers. The first material of the first insulating layers 132 can be deposited, for example, by chemical vapor deposition (CVD). For example, if silicon oxide is employed for the first insulating layers 132, tetraethylorthosilicate (TEOS) can be employed as the precursor material for the CVD process. The second material of the first sacrificial material layers 142 can be formed, for example, CVD or atomic layer deposition (ALD).

The thicknesses of the first insulating layers 132 and the first sacrificial material layers 142 can be in a range from 20 nm to 50 nm, although lesser and greater thicknesses can be employed for each first insulating layer 132 and for each first sacrificial material layer 142. The number of repetitions of the pairs of a first insulating layer 132 and a first sacrificial material layer 142 can be in a range from 2 to 1,024, and typically from 8 to 256, although a greater number of repetitions can also be employed. In one embodiment, each first sacrificial material layer 142 in the first-tier alternating stack (132, 142) can have a uniform thickness that is substantially invariant within each respective first sacrificial material layer 142.

A first insulating cap layer 170 is subsequently formed over the stack (132, 142). The first insulating cap layer 170 includes a dielectric material, which can be any dielectric material that can be employed for the first insulating layers 132. In one embodiment, the first insulating cap layer 170 includes the same dielectric material as the first insulating layers 132. The thickness of the insulating cap layer 170 can be in a range from 20 nm to 300 nm, although lesser and greater thicknesses can also be employed.

The first insulating cap layer 170 and the first-tier alternating stack (132, 142) can be patterned to form a first retro-stepped cavity 169 along an interface between the word line contact via region 200 and the through-peripheral-stack via region 500. The first stepped surfaces can be formed, for example, by forming a mask 104 (e.g., photoresist and/or hardmask masking layer) with an opening therein, etching a cavity within the levels of the first insulating cap layer 170, and iteratively expanding the etched area and vertically recessing the cavity by etching each pair of a first insulating layer 132 and a first sacrificial material layer 142 located directly underneath the bottom surface of the etched cavity within the etched area. If the first insulating cap layer 170 has a different thickness from the thickness of each first sacrificial material layer 142, a first mask can be employed to form an opening through the first insulating cap layer 170 for the entire staircase region, and at least another mask can be employed to alternately perform a trimming process and an etch for a plurality of iterations to form the staircase.

First stepped terraces are formed on both sides of the interface between the through-peripheral-stack via region 500 and each word line contact via region 200 through the first-tier alternating stack (132, 142), thereby dividing the first-tier alternating stack (132, 142) into two physically disjoined portions. The portion of the first-tier alternating stack (132, 142) located within the memory array region 100 and the word line contact via region 200 is herein referred to as a first active alternating stack S1A. The portion of the first-tier alternating stack (132, 142) located within the through-peripheral-stack via region 500 is herein referred to as a first peripheral alternating stack S1P.

Figure 25:
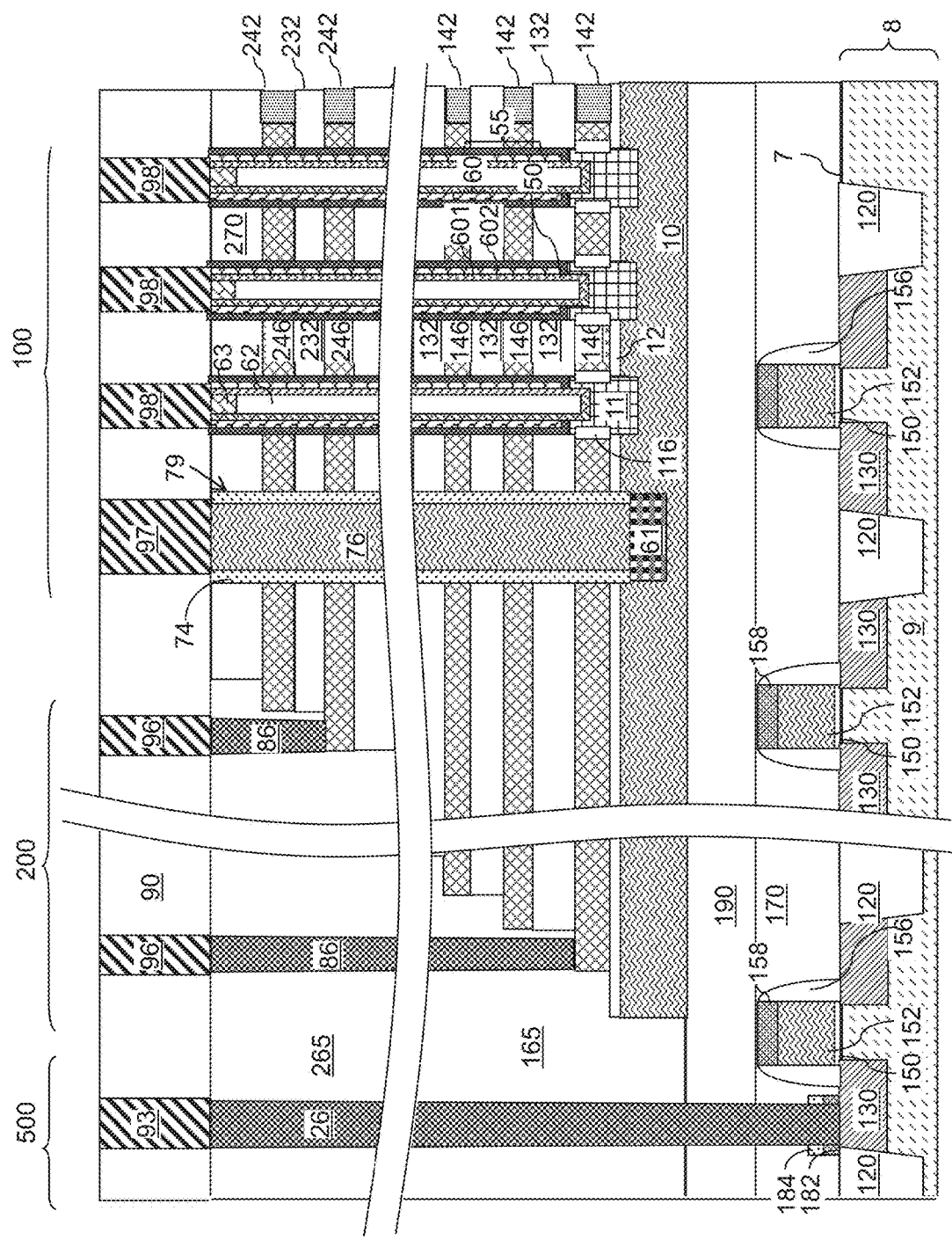
FIG. 25 is a vertical cross-sectional view along line A-A' in FIG. 1 of an exemplary structure according to an embodiment of the present disclosure.

The first stepped terraces of the first active alternating stack S1A can be located in a portion of the word line contact via region 200 that adjoins the through-peripheral-stack via region 500. The first stepped terraces of the first active alternating stack S1A and the first stepped surfaces of the first peripheral alternating stack S1P collectively define the first retro-stepped cavity. In one embodiment, the first retro-stepped cavity can laterally isolate the first active alternating stack S1A from at least one first peripheral alternating stack S1P. The first stepped terraces are located only on two opposing sides of the first tier structure facing a portion of the peripheral devices which comprise word line decoder circuitry 702. There are no stepped terraces located on additional sides of the first tier structure facing a portion of the peripheral devices which comprise the bit line decoder circuitry 704, as shown in FIG. 2B. Since there are no stepped terraces located on additional sides of the first tier structure, the layers of the first active alternating stack 51A can contact the respective layers of the first peripheral alternating stack S1P facing a portion of the peripheral devices which comprise the bit line decoder circuitry 704, as shown in FIG. 25. In other words, the insulating layers 132 are continuous between the active and peripheral alternating stacks (S1A, S1P), while the electrically conductive layers (e.g., word lines) 146 of the first active alternating stack S1A contact respective spacer layers (e.g., silicon nitride layers) 142 of the first peripheral alternating stack S1P in an area between the active array region 100 and the peripheral region 700 containing the bit line decoder circuitry 704.

Figure 3:
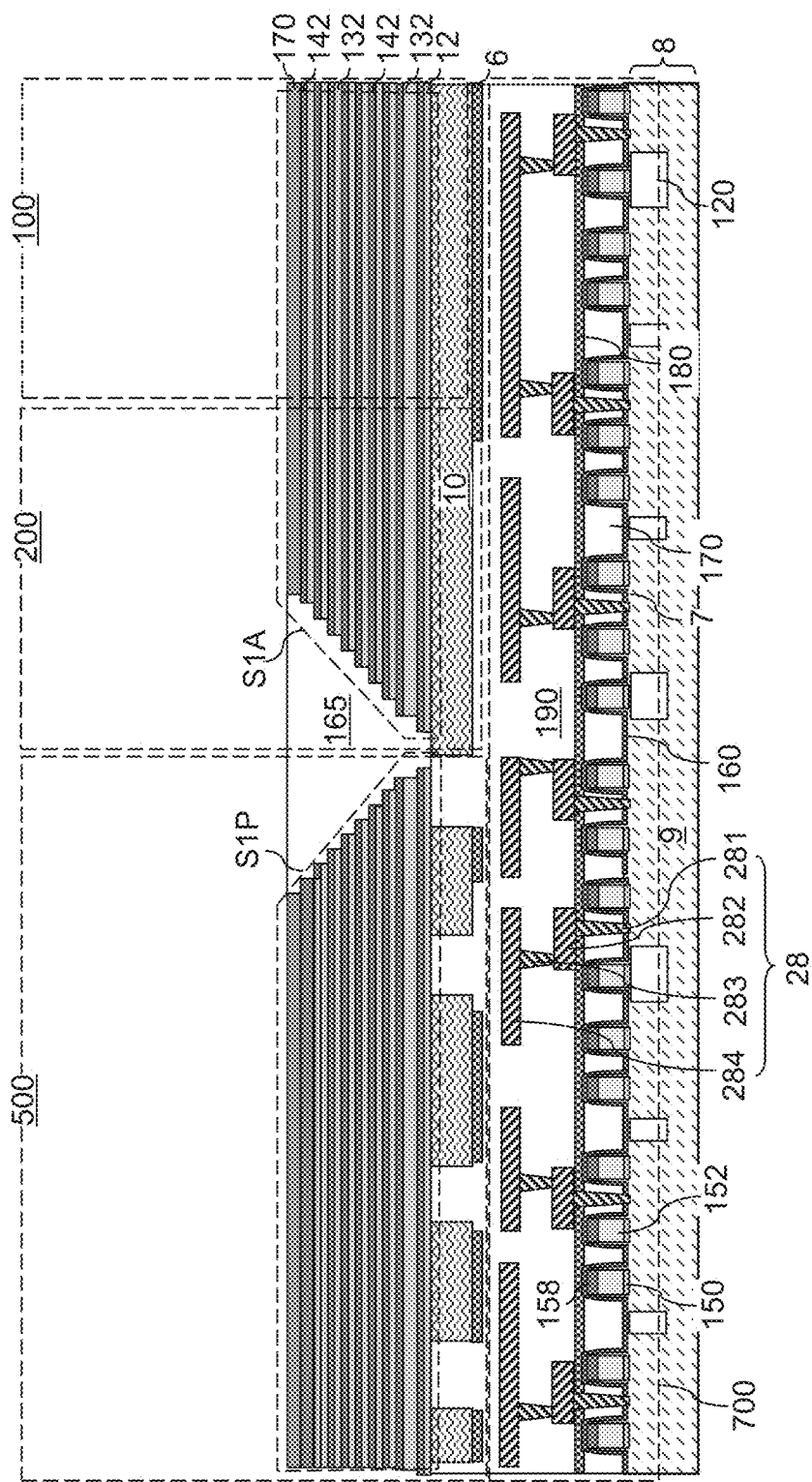
FIG. 3 is a vertical cross-sectional view of the first exemplary structure after formation of a first retro-stepped dielectric material portion according to the first embodiment of the present disclosure.

Referring to FIG. 3, the masking layer 104 can be removed, for example, by ashing. A dielectric material can be deposited to fill the first stepped cavity 169 to form a first-tier retro-stepped dielectric material portion 165. As used herein, a "retro-stepped" element refers to an element that has stepped surfaces and a horizontal cross-sectional area that increases monotonically as a function of a vertical distance from a top surface of a substrate on which the element is present. The first-tier alternating stack (132, 142) (which include the first active alternating stack S1A and the first peripheral alternating stack S1P), the first insulating cap layer 170, and the first-tier retro-stepped dielectric material portion 165 collectively constitute a first tier structure, which is an in-process structure that is subsequently modified.

The first peripheral alternating stack S1P and at least a portion of the memory array region 100 overlie the peripheral devices in the peripheral device region 700. Each of the first active alternating stack S1A and the first peripheral alternating stack S1P comprises an alternating stack of first insulating layers 132 and first spacer material layers 142 patterned to provide respective first stepped terraces. The first retro-stepped dielectric material portion 165 is located in the first tier structure (132, 142, 170, 165) and overlies, and contacts, first stepped terraces of the first active alternating stack S1A and the first peripheral alternating stack SIP.

Figure 4:
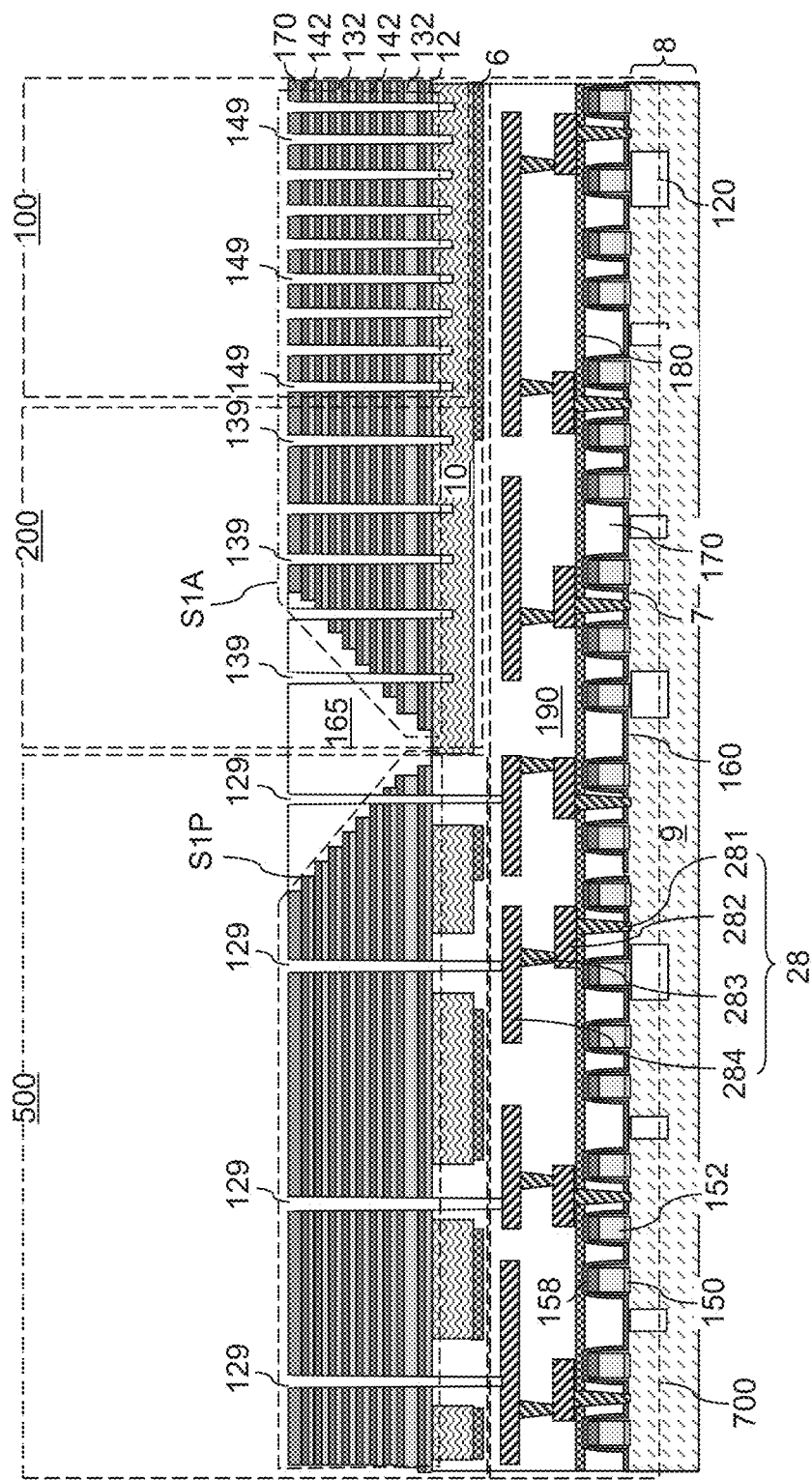
FIG. 4 is a vertical cross-sectional view of the first exemplary structure after formation of first memory openings and first peripheral via cavities according to the first embodiment of the present disclosure.

Referring FIG. 4, first memory openings 149, optional first support openings 139, and first peripheral via cavities (i.e., openings) 129 can be formed in the memory array region 100, the word line contact via region 200, and the through-peripheral-stack via region 500, respectively. The first memory openings 149, the optional first support openings 139, and the first peripheral via cavities 129 can be formed by applying and patterning a photoresist layer (not shown) over the first tier structure (132, 142, 170, 165), and transferring the pattern of openings in the photoresist layer through the first tier structure (132, 142, 170, 165) and into underlying material portions employing an anisotropic etch process. The first memory openings 149 are formed in the memory array region 100 areas in which memory stack structures are subsequently formed to provide a three-dimensional array of memory elements. The first support openings 139 are formed in areas of regions 100 and/or 200 in which dummy memory stack structures that are not electrically connected are to be subsequently formed to provide structural support during replacement of the first sacrificial material layers 142 with first electrically conductive layers. The first peripheral via cavities 129 are formed in areas in which through-peripheral-stack via structures are to be subsequently formed to provide vertically conductive paths that connect the lower level metal interconnect structures 28 to upper level metal interconnect structures to be subsequently formed above the first tier structure.

The area and/or the lateral dimensions (e.g., width along horizontal directions, a diameter, a major axis, a minor axis, etc.) of each of the first peripheral via cavities 129 can be greater than the area and/or lateral dimensions of the first memory openings 149 and optional first support openings 139. The chemistry of the anisotropic etch process can be selected such that the etch rate depends on the accessibility of the reactive ions to the bottom of cavities that are formed through the first tier structure (132, 142, 170, 165). In this case, the etch rate for the first peripheral via cavities 129 can be greater than the etch rate for the first memory openings 149 and the first support openings 139. Consequently, the depth of the wider first peripheral via cavities 129 can be greater than the depths of the narrower first memory openings 149 and optional first support openings 139. Further, the first peripheral via cavities 129 can be more sparsely populated (i.e., formed with a larger pitch or smaller density) than the first memory openings 149 to enhance the etch rate for the first peripheral via cavities 129 relative to the etch rate for the first memory openings 149. The phenomenon of dependency of the etch rate on the geometry of the cavities being etched is generally referred to as a reactive ion etch lag phenomenon, or a "RIE lag" phenomenon.

The first peripheral via cavities 129 are formed through the first peripheral alternating stack S1P. Optionally at least one of the first peripheral via cavities 129 can be formed though the first peripheral alternating stack S1P and the first retro-stepped dielectric material portion 165. The first memory openings 149 are formed through the first active alternating stack S1A. The first support openings 139 are formed through the first active alternating stack S1A and the first retro-stepped dielectric material portion 165. The first memory openings 149 and the first support openings 139 can be formed through the first active alternating stack S1A concurrently (i.e., in the same lithography and etching steps) with formation of the first peripheral via cavities 129 through the first peripheral alternating stack SIP.

In one embodiment, the first peripheral via cavities 129 can be formed by an anisotropic etch process that employs a subset of the lower level metal interconnect structures 28 (which may be a subset of the lower level topmost metal structures 284) as an etch stop structure. The etch chemistry and the locations of the subset of the lower level metal interconnect structures 28 that are employed as the etch stop structure can be selected such that the bottom surfaces of the first memory openings 149 and the first support openings 139 are formed in an upper portion of the planar semiconductor material layer 10 at the end of the anisotropic etch process.

Figure 5:
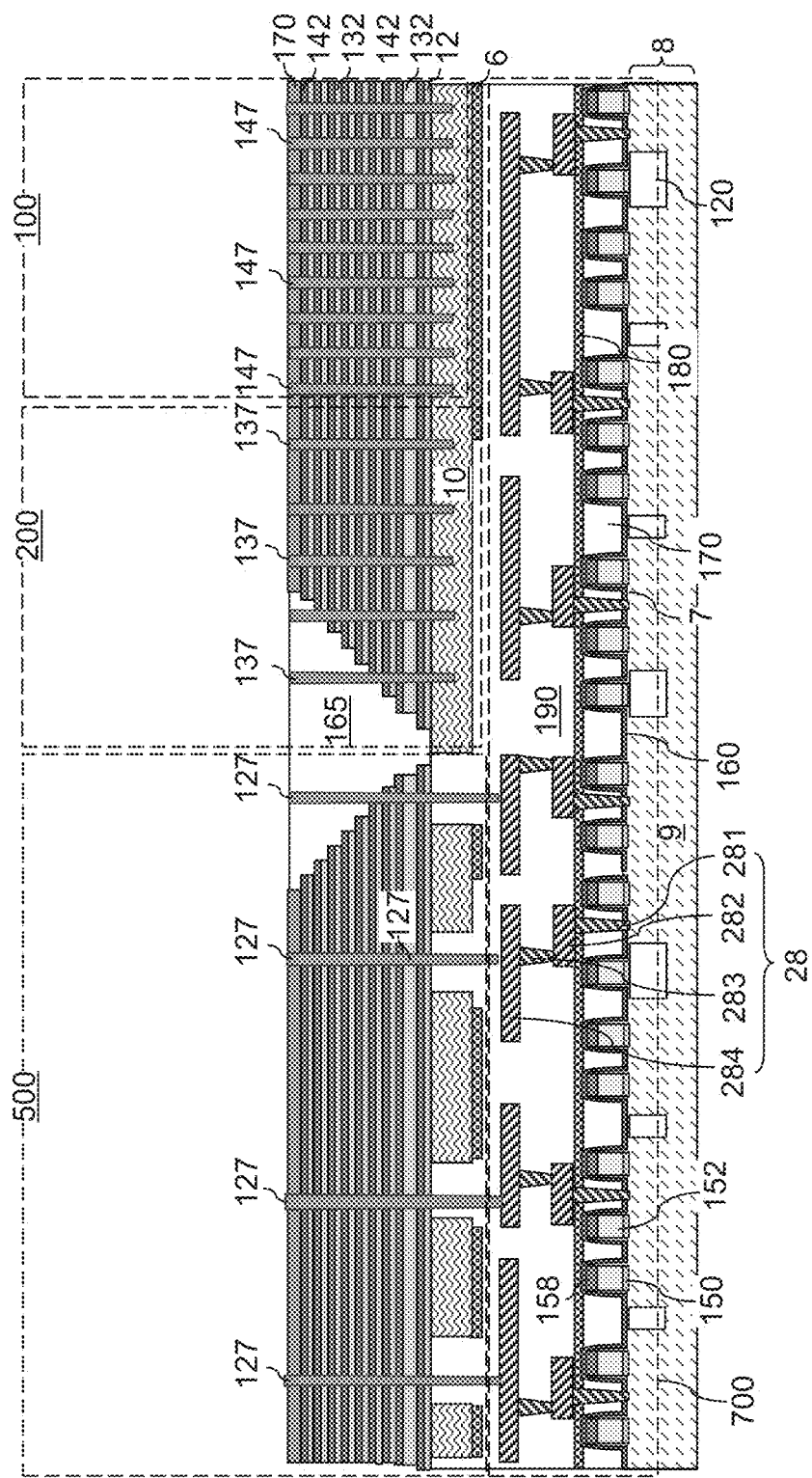
FIG. 5 is a vertical cross-sectional view of the first exemplary structure after formation of sacrificial memory opening fill structures and sacrificial via fill structures according to the first embodiment of the present disclosure.

Referring to FIG. 5, an optional sacrificial liner (not shown) can be formed on the physically exposed semiconductor surfaces underneath the first memory openings 149 and the first support openings 139. In one embodiment, the sacrificial liner can be formed by conversion of physically exposed surface portions of the planar semiconductor material layer 10 into dielectric material portions such as dielectric semiconductor oxide portions, dielectric semiconductor nitride portions, and dielectric semiconductor oxynitride portions. Plasma oxidation, thermal oxidation, plasma nitridation, and/or thermal nitridation process can be employed. Alternatively, the sacrificial liner can be formed by deposition of a conformal dielectric material layer, which can include a dielectric semiconductor oxide (such as silicon oxide), a dielectric semiconductor nitride (such as silicon nitride), and/or a dielectric metal oxide (such as aluminum oxide). The sacrificial liner can have a thickness in a range from 1 nm to 6 nm, although lesser and greater thicknesses can also be employed.

A sacrificial fill material is deposited in the first memory openings 149, the first support openings 139, and the first peripheral via cavities 129. The sacrificial fill material is a material that can be removed selective to the sacrificial liner, or selective to the materials of the first-tier alternating stack (132, 142) and the planar semiconductor material layer 10. In one embodiment, the sacrificial fill material can include a semiconductor material such as polysilicon, amorphous silicon, amorphous germanium, an amorphous silicon-germanium alloy. Alternatively, the sacrificial fill material can include a dielectric material such as borosilicate glass or organosilicate glass. Alternatively, the sacrificial fill material can include amorphous carbon, diamond-like carbon (DLC), or a silicon-containing polymer. Excess portions of the sacrificial material can be removed from above the first-tier structure (132, 142, 170, 165), for example, by a recess etch and/or chemical mechanical planarization.

Sacrificial memory opening fill structures 147 are formed in the first memory openings 149. Sacrificial via fill structures 127 are formed in the first peripheral via cavities 129. Sacrificial support opening fill structures 137 are formed in the first support openings 139. The sacrificial memory opening fill structures 147, the sacrificial via fill structures 127, and the sacrificial support opening fill structures 137 can be formed simultaneously by a same material deposition and planarization process.

Figure 6:
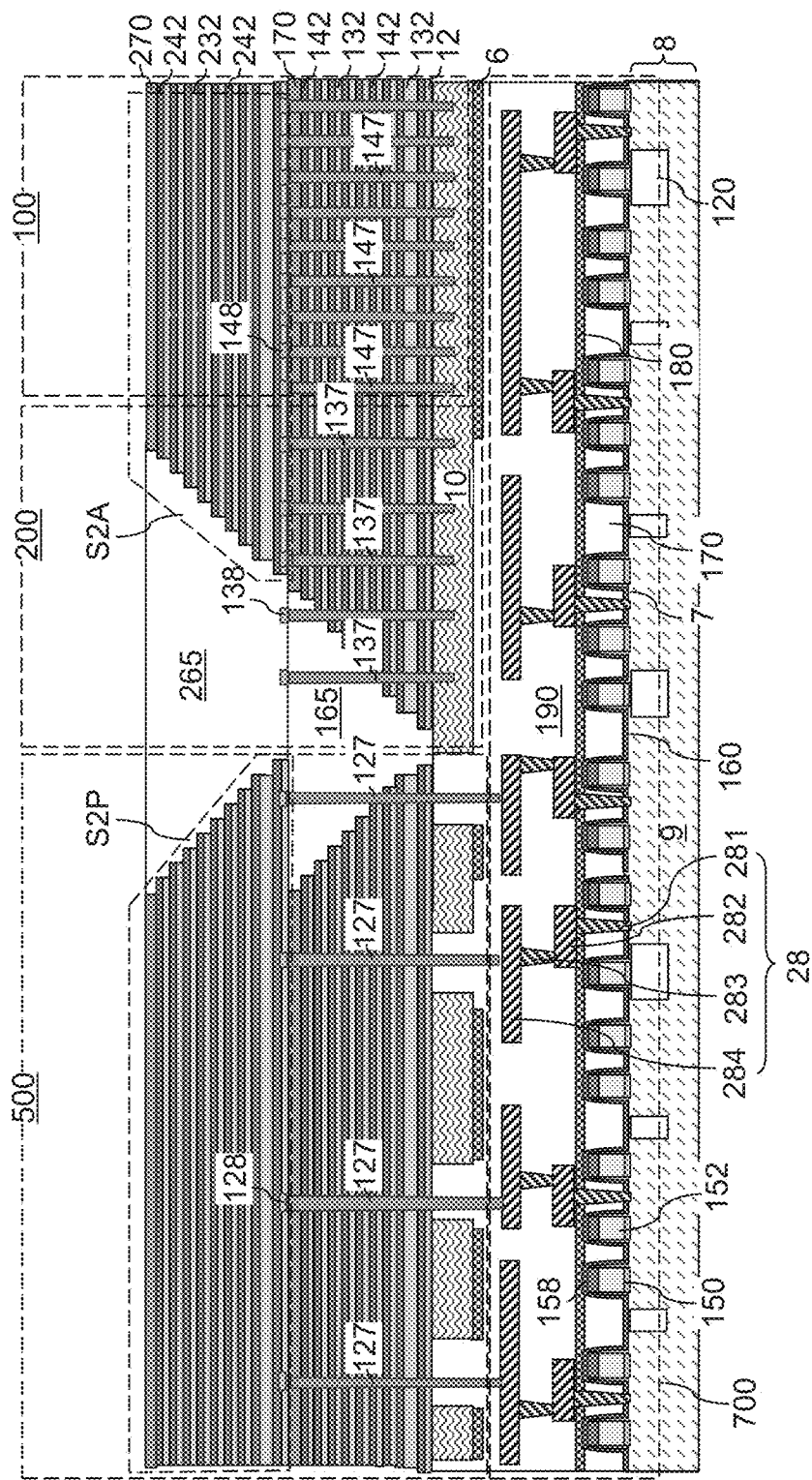
FIG. 6 is a vertical cross-sectional view of the first exemplary structure after formation of a second tier structure including patterned portions of an alternating stack of second insulating layers and second spacer material layers and a second retro-stepped dielectric material portion according to the first embodiment of the present disclosure.

Referring to FIG. 6, a second tier structure can be formed over the first tier structure (132, 142, 170, 165). The second tier structure can include an additional alternating stack of insulating layers and spacer material layers, which can be sacrificial material layers. For example, a second alternating stack (232, 242) of material layers can be subsequently formed on the top surface of the first alternating stack (132, 142). The second stack (232, 242) includes an alternating plurality of third material layers and fourth material layers. Each third material layer can include a third material, and each fourth material layer can include a fourth material that is different from the third material. In one embodiment, the third material can be the same as the first material of the first insulating layer 132, and the fourth material can be the same as the second material of the first sacrificial material layers 142.

In one embodiment, the third material layers can be second insulating layers 232 and the fourth material layers can be second spacer material layers that provide vertical spacing between each vertically neighboring pair of the second insulating layers 232. In one embodiment, the third material layers and the fourth material layers can be second insulating layers 232 and second sacrificial material layers 242, respectively. The third material of the second insulating layers 232 may be at least one insulating material. The fourth material of the second sacrificial material layers 242 may be a sacrificial material that can be removed selective to the third material of the second insulating layers 232. The second sacrificial material layers 242 may comprise an insulating material, a semiconductor material, or a conductive material. The fourth material of the second sacrificial material layers 242 can be subsequently replaced with electrically conductive electrodes which can function, for example, as control gate electrodes of a vertical NAND device.

In one embodiment, each second insulating layer 232 can include a second insulating material, and each second sacrificial material layer 242 can include a second sacrificial material. In this case, the second stack (232, 242) can include an alternating plurality of second insulating layers 232 and second sacrificial material layers 242. The third material of the second insulating layers 232 can be deposited, for example, by chemical vapor deposition (CVD). The fourth material of the second sacrificial material layers 242 can be formed, for example, CVD or atomic layer deposition (ALD).

The third material of the second insulating layers 232 can be at least one insulating material. Insulating materials that can be employed for the second insulating layers 232 can be any material that can be employed for the first insulating layers 132. The fourth material of the second sacrificial material layers 242 is a sacrificial material that can be removed selective to the third material of the second insulating layers 232. Sacrificial materials that can be employed for the second sacrificial material layers 242 can be any material that can be employed for the first sacrificial material layers 142. In one embodiment, the second insulating material can be the same as the first insulating material, and the second sacrificial material can be the same as the first sacrificial material.

The thicknesses of the second insulating layers 232 and the second sacrificial material layers 242 can be in a range from 20 nm to 50 nm, although lesser and greater thicknesses can be employed for each second insulating layer 232 and for each second sacrificial material layer 242. The number of repetitions of the pairs of a second insulating layer 232 and a second sacrificial material layer 242 can be in a range from 2 to 1,024, and typically from 8 to 256, although a greater number of repetitions can also be employed. In one embodiment, each second sacrificial material layer 242 in the second stack (232, 242) can have a uniform thickness that is substantially invariant within each respective second sacrificial material layer 242.

In one embodiment, landing pads (128, 138, 148) can be formed in the bottommost second insulating layer 232 prior to forming additional layers of the second alternating stack (232, 242), i.e., prior to forming the bottommost second sacrificial material layer 242 and the layers thereabove, to facilitate alignment of various openings to be subsequently formed through the second stack (232, 242) within underlying sacrificial fill structures, i.e., the respective sacrificial memory opening fill structures 147, the sacrificial via fill structures 127, and the sacrificial support opening fill structures 137. Alternatively, the landing pads may be formed in the first insulating cap layer 170 by forming wider openings in the insulating cap layer 170 than in the first alternating stack (132, 242). In this case, the respective landing pads (128, 138, 148) may be formed concurrently with the underlying respective sacrificial structure (127, 137, 147) during the same sacrificial material deposition step.

A second insulating cap layer 270 can be subsequently formed over the second alternating stack (232, 242). The second insulating cap layer 270 includes a dielectric material that is different from the material of the second sacrificial material layers 242. In one embodiment, the second insulating cap layer 270 can include silicon oxide. In one embodiment, the first and second sacrificial material layers (142, 242) can comprise silicon nitride.

The second insulating cap layer 270 and the second-tier alternating stack (232, 242) can be patterned to form a second retro-stepped cavity along an interface between the word line contact via region 200 and the through-peripheral-stack via region 500. The second stepped surfaces can be formed, for example, by forming a masking layer with an opening therein, etching a cavity within the levels of the second insulating cap layer 270, and iteratively expanding the etched area and vertically recessing the cavity by etching each pair of a second insulating layer 232 and a second sacrificial material layer 242 located directly underneath the bottom surface of the etched cavity within the etched area.

Second stepped terraces are formed on both sides of the interface between the through-peripheral-stack via region 500 and each word line contact via region 200 through the second-tier alternating stack (232, 242), thereby dividing the second-tier alternating stack (232, 242) into two physically disjoined portions. The portion of the second-tier alternating stack (232, 242) located within the memory array region 200 and the word line contact via region 200 is herein referred to as a second active alternating stack S2A. The portion of the second-tier alternating stack (232, 242) located within the through-peripheral-stack via region 500 is herein referred to as a second peripheral alternating stack S2P.

The second stepped terraces of the second active alternating stack S2A can be located in a portion of the word line contact via region 200 that adjoins the through-peripheral-stack via region 500. In one embodiment, the second stepped terraces of the second active alternating stack S2A are formed outside, i.e., at a location laterally offset from, the entire area of the first stepped terraces of the first active alternating stack S1A. The area of the second stepped surface of the second alternating stack S2A can adjoin the area of the first stepped surface of the first alternating stack S1A.

The second stepped terraces of the second active alternating stack S2A and the second stepped surfaces of the second peripheral alternating stack S2P collectively define the second retro-stepped cavity. In one embodiment, the second stepped terraces of the second peripheral alternating stack S2P overlie the area of the first stepped terraces of the first peripheral alternating stack S1P.

In one embodiment, the second retro-stepped cavity laterally isolate the second active alternating stack S2A from at least one second active peripheral alternating stack S2P. The first stepped terraces and the second stepped terraces are located only on two opposing sides of the respective first and second tier structures facing a portion of the peripheral devices which comprise word line decoder circuitry 702. There are no stepped terraces located on additional sides of the respective first and second tier structures facing a portion of the peripheral devices which comprise the bit line decoder circuitry 704, as shown in FIG. 2B. Since there are no stepped terraces located on additional sides of the first and second tier structures, the layers of the first and second active alternating stacks (S1A, S2A) can contact the respective layers of the first and second active peripheral alternating stacks (S1P, S2P) facing a portion of the peripheral devices which comprise the bit line decoder circuitry 704, as shown in FIG. 25. In other words, the insulating layers (132, 232) are continuous between the first and second active and peripheral alternating stacks (i.e., between S1A and S1P and between S2A and S2P), while the electrically conductive layers (e.g., word lines) (146, 246) of the first and second active alternating stacks (S1A, S2A) contact respective spacer layers (e.g., silicon nitride layers) (142, 242) of the respective first and second peripheral alternating stacks (S1P, S2P) in an area between the active array region 100 and the peripheral region 700 containing the bit line decoder circuitry 704.

The masking layer can be removed, for example, by ashing. A dielectric material can be deposited to fill the second stepped cavity to form a second-tier retro-stepped dielectric material portion 265. The second-tier alternating stack (232, 242) (which include the second active alternating stack S2A and the second peripheral alternating stack S2P), the second insulating cap layer 270, and the second-tier retro-stepped dielectric material portion 265 collectively constitute a second tier structure, which is an in-process structure that is subsequently modified. Each of the second active alternating stack S2A and the second peripheral alternating stack S2P comprises an alternating stack of second insulating layers 232 and second spacer material layers 242 patterned to provide respective second stepped terraces. A second retro-stepped dielectric material portion 265 is located in the second tier structure (232, 242, 270, 265) and overlies, and contacts, second stepped terraces of the second active alternating stack S2A and the second peripheral alternating stack S2P. The second active alternating stack S2A overlies the first active alternating stack S1A, and the second peripheral alternating stack S2P overlies the first peripheral alternating stack S1P.

Figure 7:
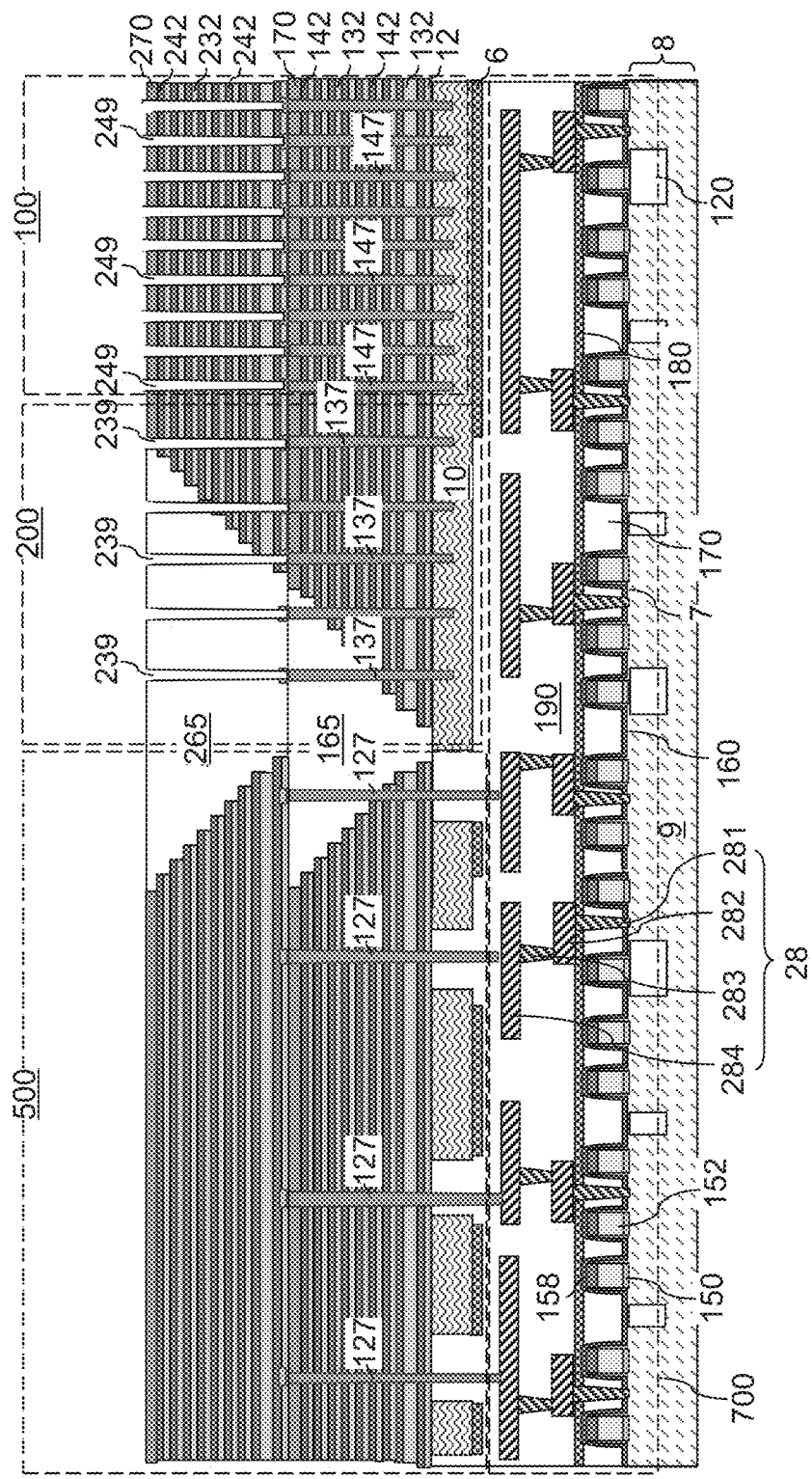
FIG. 7 is a vertical cross-sectional view of the first exemplary structure after formation of second memory openings according to the first embodiment of the present disclosure.

Referring to FIG. 7, second memory openings 249 and second support openings 239 can be formed in the memory array region 100 and the word line contact via region 200, respectively. The second memory openings 249 and the second support openings 239 can be formed by applying and patterning a photoresist layer (not shown) over the second tier structure (232, 242, 270, 265), and transferring the pattern of openings in the photoresist layer through the second tier structure (232, 242, 270, 265) employing an anisotropic etch process. The second memory openings 249 are formed over the sacrificial memory opening fill structures 147. A top surface of an underlying sacrificial memory opening fill structure 147 (which can be the top surface of the respective landing pad 148 if the landing pad 148 is present) can be physically exposed underneath each second memory opening 249. The second support openings 239 are formed over the sacrificial support opening fill structures 137 (e.g., to their respective landing pads 138 if present). A top surface of an underlying sacrificial support opening fill structure 137 can be physically exposed underneath each second support openings 239. However, there are no openings in region 500 to structures 127.

Figure 8:
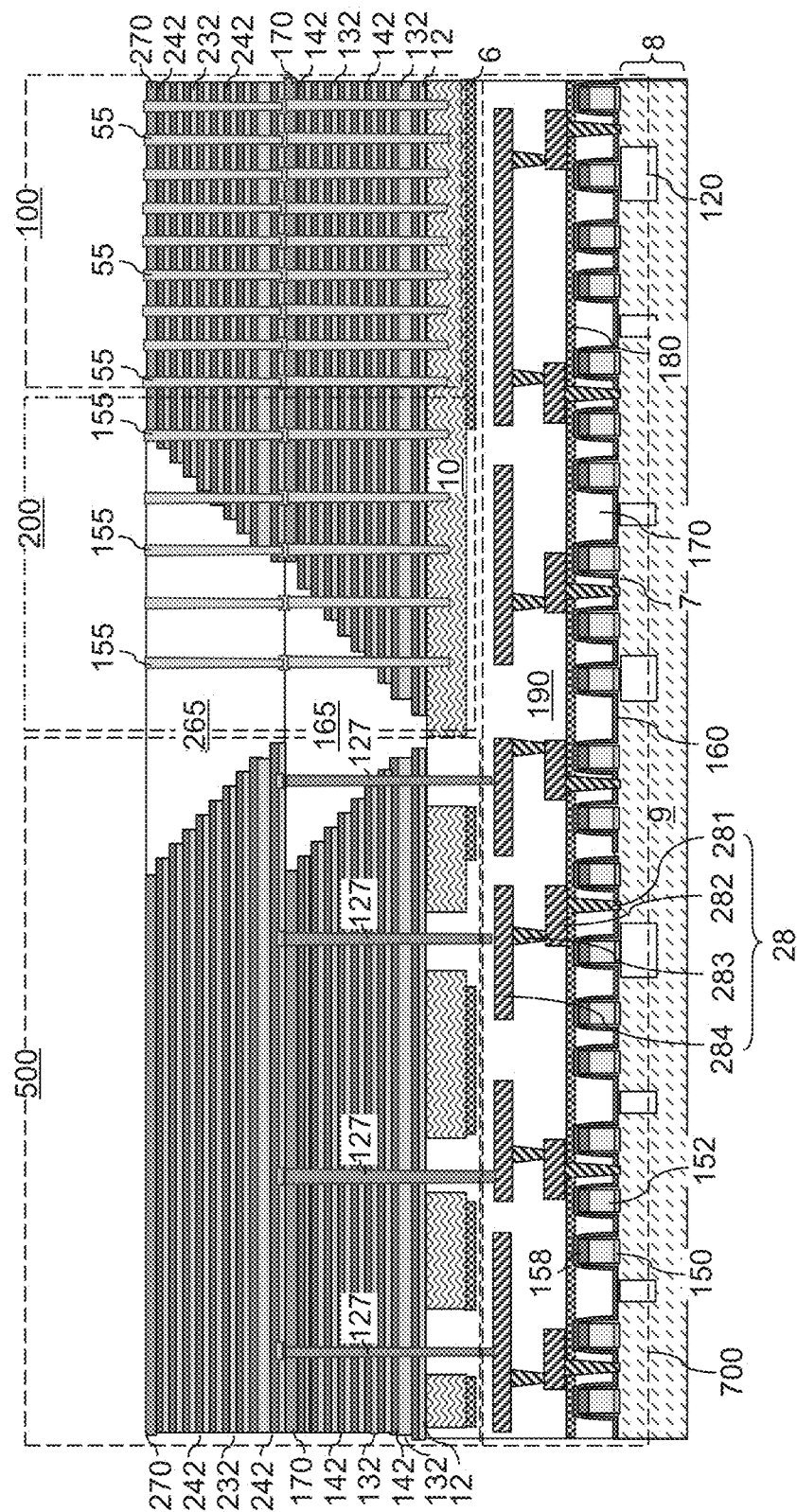
FIG. 8 is a vertical cross-sectional view of the first exemplary structure after formation of memory stack structures according to the first embodiment of the present disclosure.

Referring to FIG. 8, a selective etch process can be performed to remove the sacrificial material of the sacrificial memory opening fill structures 147 and the sacrificial support opening fill structures 137 (including their respective landing pads 148 and 138, if present). In a preferred embodiment, collateral etch of the materials of the second-tier alternating stack (232, 242) and the second insulating cap layer 270 is minimized during removal of the sacrificial material of the sacrificial memory opening fill structures 147 and the sacrificial support opening fill structures 137. In one embodiment, the sacrificial liners (not shown) located at the bottom of each of the sacrificial memory opening fill structures 147 and the sacrificial support opening fill structures 137 can prevent collateral etching of the semiconductor material of the planar semiconductor material layer 10. In an illustrative example, if the sacrificial memory opening fill structures 147 and the sacrificial support opening fill structures 137 include a semiconductor material, a wet etch process employing KOH or TMAH can be employed to remove the sacrificial memory opening fill structures 147 and the sacrificial support opening fill structures 137. The sacrificial liners, if employed, can be subsequently removed selective to the planar semiconductor material layer 10.

Each continuous volume including a combination of a first memory opening and a second memory opening is herein referred to as an inter-tier memory opening. Each continuous volume including a combination of a first support opening and a second support opening is herein referred to as an inter-tier support opening.

Pedestal channel portions (not shown) can be optionally formed at the bottom of each inter-tier memory opening and each inter-tier support opening by a selective semiconductor deposition process. Memory stack structures 55 and support pillar structures 155 can be formed in the inter-tier memory openings and in the inter-tier support openings, respectively, during the same deposition steps. Each instance of the memory stack structures 55 and each instance of the support pillar structures 155 can have an identical set of elements, i.e., can be structurally the same, except for variations in dimensions caused by the lateral dimensions of the inter-tier memory openings and the inter-tier support openings. Elements within each instance of the memory stack structures 55 and the support pillar structures 155 are described in a subsequent section. Optional dielectric cores (not shown) and drain regions (not shown) can be formed in the inter-tier memory openings and the inter-tier support openings.

Figure 9:
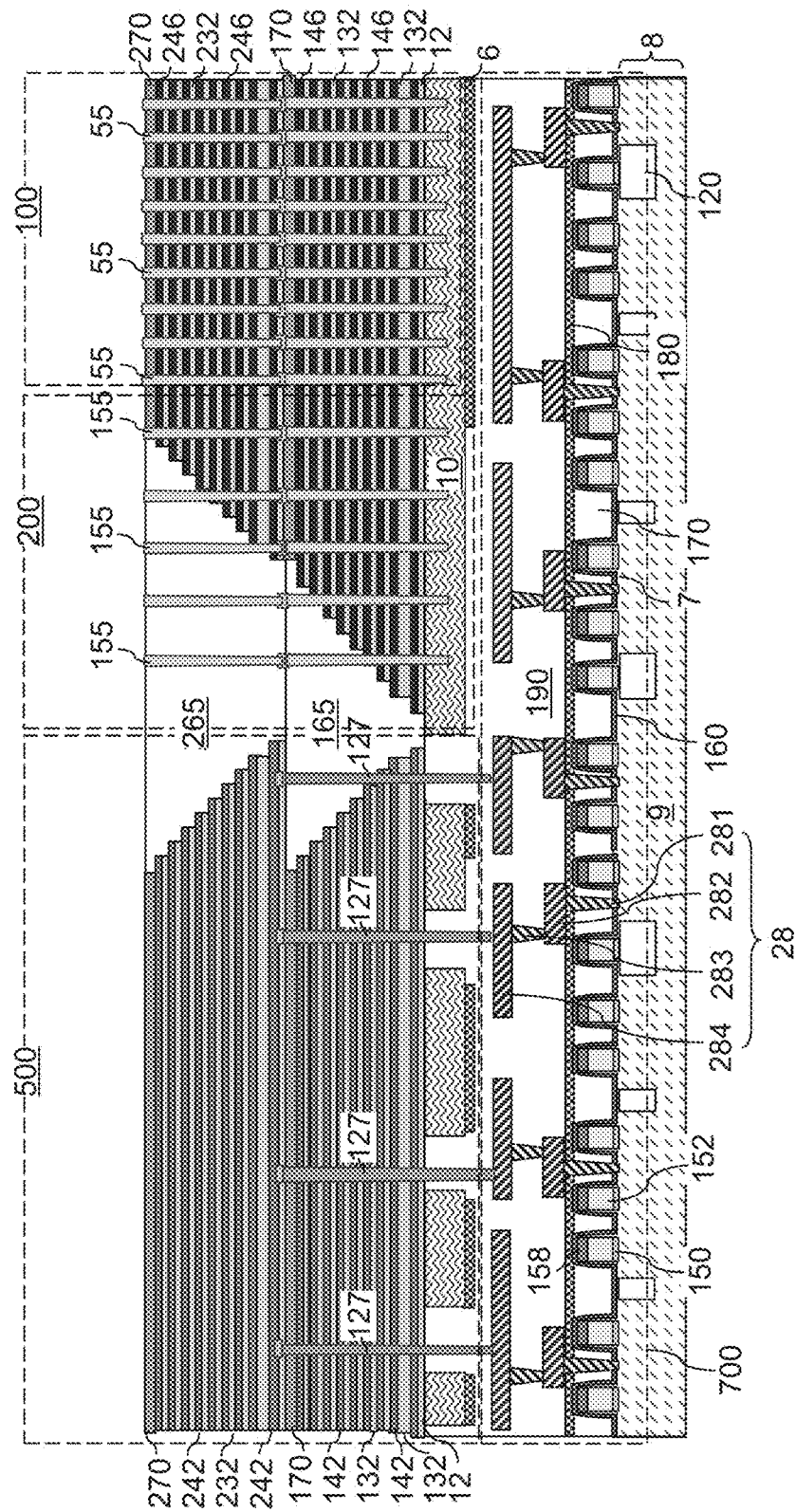
FIG. 9 is a vertical cross-sectional view of the first exemplary structure after replacement of sacrificial material layers in active alternating stacks with electrically conductive layers according to the first embodiment of the present disclosure.

Referring to FIG. 9, the spacer material layers, i.e., the sacrificial material layers (142, 242), in the first and second active alternating stacks (S1A, S2A) are replaced with first electrically conductive layers 146 and second electrically conductive layers 246, respectively. Replacement of the portions of the first and second spacer material layers (142, 242) in the first and second active alternating stacks (S1A, S2A) with the electrically conductive layers (146, 246) is performed without removing portions of the first and second spacer material layers (i.e., the first sacrificial material layers 142 and the second sacrificial material layers 242) in the first and second peripheral alternating stacks (S1P, S2P). In one embodiment, the first and second spacer material layers (142, 242) can comprise a dielectric material different from materials of the first and second insulating layers (132, 232). For example, the first and second spacer material layers (142, 242) can comprise silicon nitride, and the first and second insulating layers (132, 232) can comprise silicon oxide.

In an illustrative example, replacement of the portions of the first and second spacer material layers (142, 242) in the first and second active alternating stacks (S1A, S2A) with the electrically conductive layers (146, 246) can be performed employing backside trenches 79 that are formed through the first and second active alternating stacks (S1A, S2A) between the memory blocks 101 in region 100, as shown in FIG. 1. For example, the backside trenches can be formed between each neighboring pair of blocks of the memory stack structures 55 by forming and patterning a photoresist layer to form trenches overlying discrete areas overlying the first and second active alternating stacks (S1A, S2A), and by transferring the pattern of the trenches in the photoresist layer through the second tier structure (232, 242, 270, 265) and the first tier structure (132, 142, 170, 165). The trenches do not cut through any portion of the first and second peripheral alternating stacks (S1P, S2P). A top surface of the planar semiconductor material layer 10 can be physically exposed at the bottom of each backside trench. In one embodiment, each backside trench can extend along a first horizontal direction so that blocks of the memory stack structures 55 are laterally spaced along a second horizontal direction that is different from the first horizontal direction.

An etchant that selectively etches the materials of the sacrificial material layers (142, 242) with respect to the materials of the insulating layers (132, 232) can be introduced through the backside trenches, for example, employing an etch process. Recesses (which are herein referred to as backside recesses) are formed in volumes from which the sacrificial material layers (142, 242) are removed. The backside trenches and the backside recesses are formed from locations away from the memory stack structures 55, which are formed within the inter-tier memory openings that are also referred to as front side openings. Thus, the recesses may be formed in the memory array region 100 and the word line contact via region 200, but are not formed in the through-peripheral-stack via region 500.

The etch process can remove the materials of the sacrificial material layers (142, 242) selective to the material and the outermost layer of the memory stack structures 55 and the support pillar structures 155. A wet etch process employing a wet etch solution, or a gas phase (dry) etch process in which the etchant is introduced in a vapor phase into the backside trenches can be employed to remove the materials of the sacrificial material layers (142, 242). For example, if the sacrificial material layers (142, 242) include silicon nitride, the etch process can be a wet etch process in which the first exemplary structure is immersed within a wet etch tank including phosphoric acid, which etches silicon nitride selective to silicon oxide, silicon, and various other materials employed in the art.

Each of the plurality of backside recesses can extend substantially parallel to the top surface of the planar semiconductor material layer 10. A backside recess can be vertically bounded by a top surface of an underlying insulating layer (132 or 232) and a bottom surface of an overlying insulating layer (132 or 232). In one embodiment, each backside recess can have a uniform height throughout. Alternatively, the backside recesses may have height variations. Optionally, a backside blocking dielectric layer can be formed in the backside recesses.

In case pedestal channel portions (not shown) are present at a bottom portion of each memory stack structure 55 and/or support pillar structure 155, physically exposed surface portions of pedestal channel portions 11 can be converted into dielectric material portions by thermal conversion and/or plasma conversion of the semiconductor materials into dielectric materials to form dielectric spacers. In one embodiment, each dielectric spacer can be topologically homeomorphic to a torus, i.e., generally ring-shaped. As used herein, an element is topologically homeomorphic to a torus if the shape of the element can be continuously stretched without destroying a hole or forming a new hole into the shape of a torus.

Optionally, a backside blocking dielectric layer (not shown) can be optionally formed. The backside blocking dielectric layer, if present, comprises a dielectric material that functions as a control gate dielectric for the control gates to be subsequently formed in the backside recesses.

At least one conductive material can be deposited in the plurality of backside recesses, on the sidewalls of each backside contact trench, and over the top surface of the second tier structure. In one embodiment, the conductive material can include at least one metallic material such as a conductive metallic nitride (e.g., TiN), at least one elemental metal (W, Cu, Al), and/or an intermetallic alloy.

A plurality of electrically conductive layers (146, 246) can be formed in the plurality of backside recesses, and a continuous metallic material layer can be formed on the sidewalls of each backside contact trench and over the second tier structure (232, 246, 270, 265). A backside cavity is present in the portion of each backside contact trench that is not filled with the backside blocking dielectric layer and the continuous metallic material layer. The deposited metallic material of the continuous metallic material layer is etched back from the sidewalls of each backside contact trench and from above the second insulating cap layer 270, for example, by an isotropic or anisotropic etch. Each remaining portion of the deposited metallic material in the backside recesses constitutes an electrically conductive layer (146, 246). Each electrically conductive layer (146, 246) can be a conductive line structure.

The plurality of electrically conductive layers (146, 246) includes first electrically conductive layers 146 that replaces the first sacrificial material layers 142 and second electrically conductive layers 246 that replaces the second sacrificial material layers 242. Thus, each sacrificial material layer (142, 242) in the first and second active alternating stacks (S1A, S2A) can be replaced with an electrically conductive layer (146, 246).

Each electrically conductive layer (146, 246) can function as a combination of a plurality of control gate electrodes located at a same level and a word line electrically interconnecting, i.e., electrically shorting, the plurality of control gate electrodes located at the same level. The plurality of control gate electrodes within each electrically conductive layer (146, 246) are the control gate electrodes for the vertical memory devices including the memory stack structures 55. In other words, each electrically conductive layer (146, 246) can be a word line that functions as a common control gate electrode for the plurality of vertical memory devices.

Figure 10:
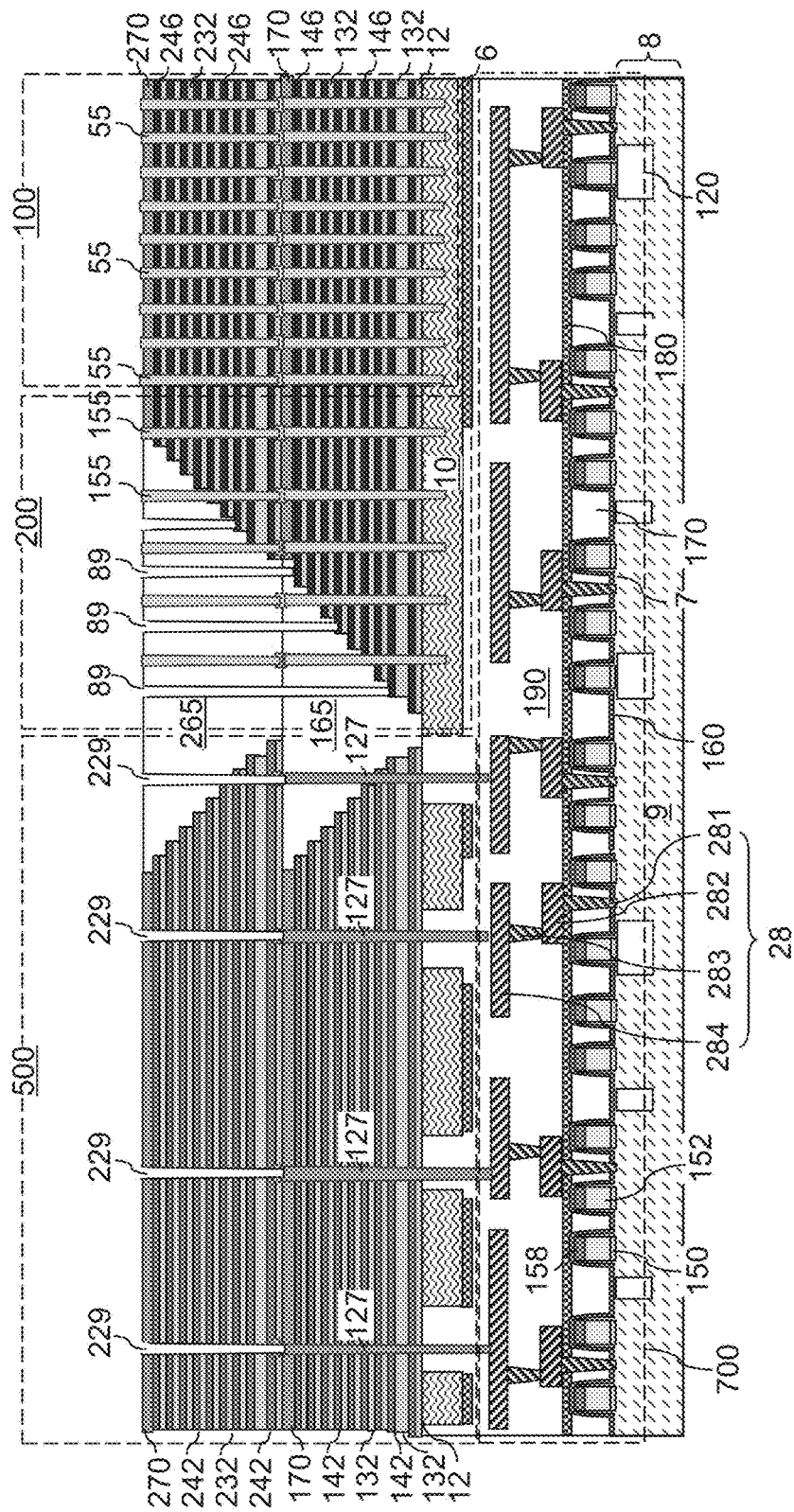
FIG. 10 is a vertical cross-sectional view of the first exemplary structure after concurrently forming second peripheral via cavities and word line contact via cavities according to the first embodiment of the present disclosure.

Referring to FIG. 10, a photoresist layer is applied over the second tier structure (232, 242, 246, 270, 265), and is lithographically patterned to form openings therein. The openings in the photoresist layer include openings in areas in which word line contact via structures are to be subsequently formed, and openings in areas overlying the second peripheral via cavities 129. An anisotropic etch is performed through the second peripheral alternating stack S2P, the second retro-stepped dielectric material portion 265, and the first retro-stepped dielectric material portion 165 to form word line contact via cavities 89 and second peripheral via cavities 229.

The word line contact via cavities 89 extend from the top surface of the second retro-stepped dielectric material portion 265 to a respective top surfaces of the electrically conductive layers (146, 246), which include horizontal surfaces of the first stepped surfaces of the first active alternating stack S1A and horizontal surfaces of the second stepped surfaces of the second active alternating stack S2A. The second peripheral via cavities 229 extend from the top surface of the second peripheral alternating stack S2P or from the top surface of the second retro-stepped dielectric material portion 265 to a top surfaces of a respective sacrificial via fill structures 127 (including landing pads 128 if present). In one embodiment, the word line contact via cavities 89 and the second peripheral via cavities 229 can be formed concurrently (i.e., at the same time) employing a same anisotropic etch process and a same patterned photoresist layer as a mask.

Figure 11:
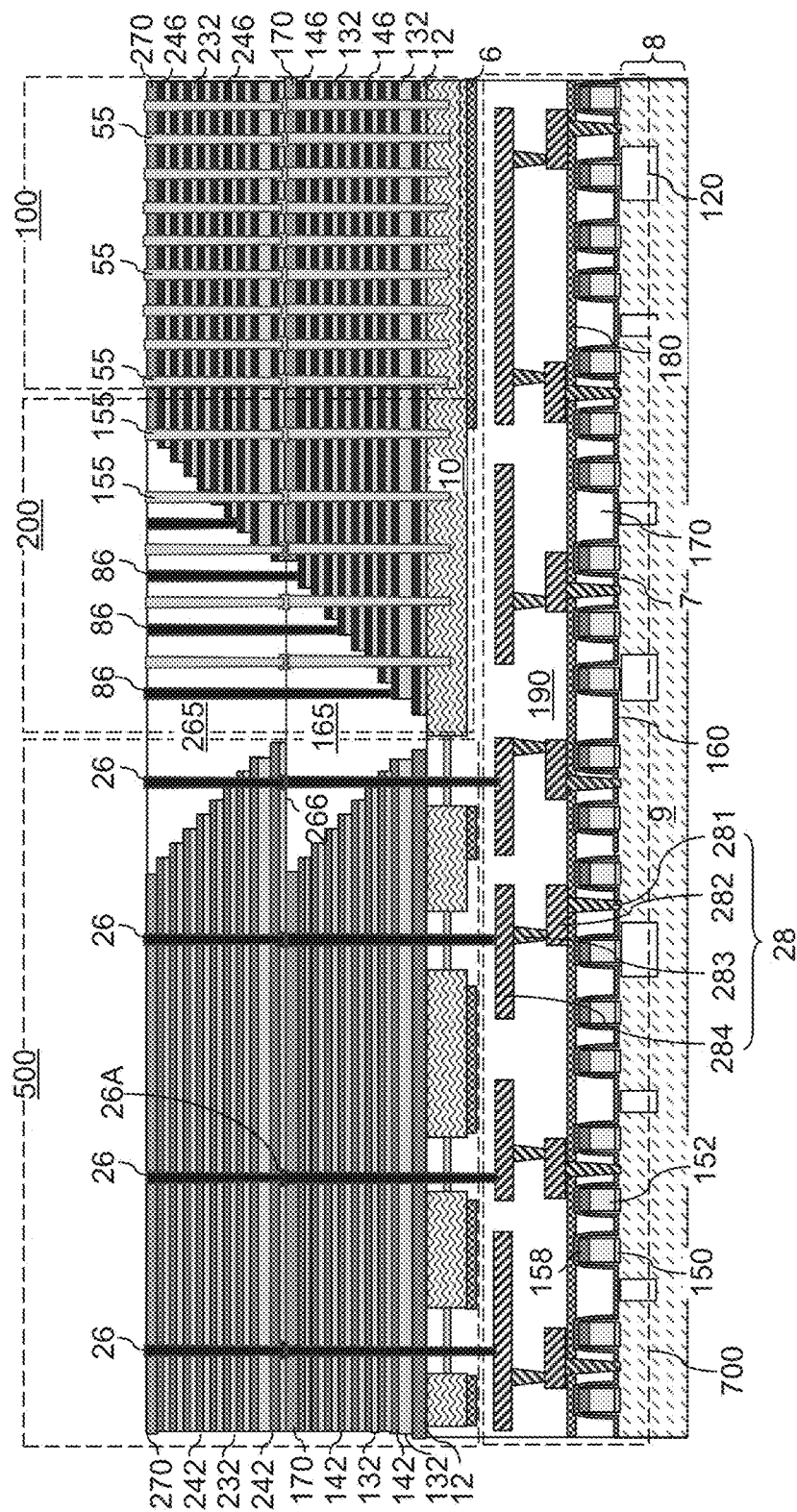
FIG. 11 is a vertical cross-sectional view of the first exemplary structure after formation of peripheral via structures and word line contact via structures according to the first embodiment of the present disclosure.

Referring to FIG. 11, an etch process can be performed to remove the sacrificial material of the sacrificial via fill structures 127. In an illustrative example, if the sacrificial via fill structures 127 include a semiconductor material such as polysilicon, a wet etch process employing KOH or TMAH can be employed to remove the sacrificial via fill structures 127 (including the landing pads 128 if present). Each continuous volume including a combination of a first peripheral via cavity and a second peripheral via cavity is herein referred to as a through-peripheral-stack via cavity. A top surface of a respective lower level metal interconnect structure 28 can be physically exposed at the bottom of each through-peripheral-stack via cavity.

At least one conductive material is deposited in the through-peripheral-stack via cavities and in the word line contact via cavities 89. For example, the at least one conductive material can include a conductive metallic nitride (such as TiN) and at least one metal (such as W, Al, Cu, or Co or a combination or an alloy thereof). Excess portions of the at least conductive material can be removed from above the top surface of the second tier structure (232, 242, 246, 270, 265) by a planarization process, which can employ a recess etch or chemical mechanical planarization (CMP).

Each remaining portion of the at least one conductive material in the through-peripheral-stack via cavities constitutes a peripheral via structure 26. Each remaining portion of the at least one conductive material in the word line contact via cavities 89 constitutes a word line contact via structure 86.

Figure 12:
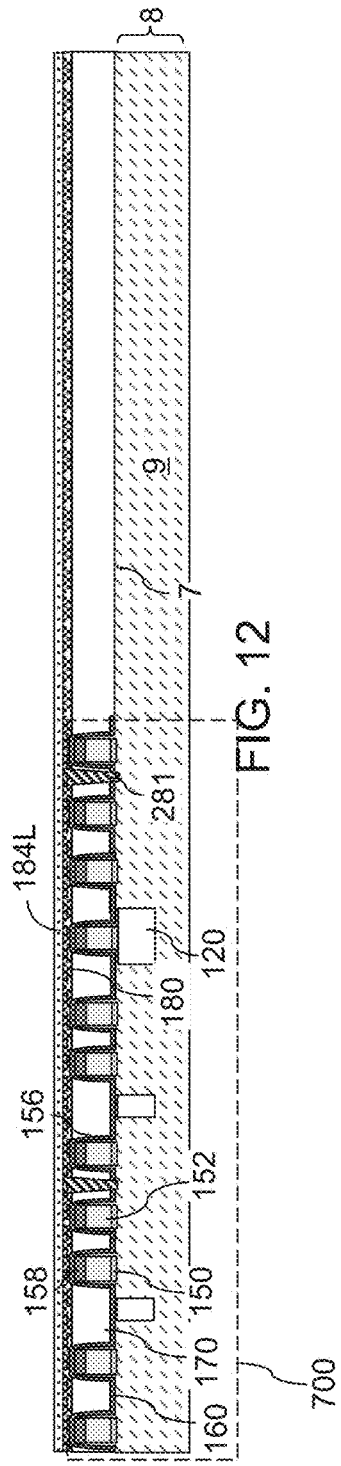
FIG. 12 is a vertical cross-sectional view of a second exemplary structure after formation of peripheral devices and a dielectric metal oxide etch stop layer over a semiconductor substrate according to a second embodiment of the present disclosure.

Referring to FIG. 12, a second exemplary structure according to a second embodiment of the present disclosure is illustrated. The second exemplary structure is similar to the first exemplary structure, except that the peripheral devices in the peripheral region 700 are formed on the side of but not under the memory array region 100. In this embodiment, an additional etch stop structure may be added to the peripheral devices, since layer 6 is preferably omitted in this embodiment. The second exemplary structure includes a substrate 8, which can include a substrate semiconductor layer 9 at least in an upper portion thereof. Various semiconductor devices can be formed on, or over, the semiconductor substrate 8 employing methods known in the art. The substrate semiconductor layer 9 is a semiconductor material layer, and can include any semiconductor material as described above. The semiconductor substrate 8 has a major surface 7, which can be, for example, a topmost surface of the substrate semiconductor layer 9. The major surface 7 can be a semiconductor surface. In one embodiment, the major surface 7 can be a single crystalline semiconductor surface. In one embodiment, the substrate semiconductor layer 9 is a silicon wafer containing doped wells.

Shallow trench isolation structures 120 can be formed in an upper portion of the substrate semiconductor layer 9 to provide electrical isolation among the semiconductor devices. The semiconductor devices can include, for example, field effect transistors including respective source regions (which are doped surface portions of the substrate semiconductor layer 9), drain regions (which are additional doped surface portions of the substrate semiconductor layer 9), channel regions (which are portions of the substrate semiconductor layer 9) located between a pair of a source region and a drain region, and gate structures (150, 152, 158). Each gate structure (150, 152, 158) can include a gate dielectric 150, a gate electrode 152, and a gate cap dielectric 158. A gate spacer 156 can be provided around each gate structure (150, 152, 158). The field effect transistors may be arranged in a CMOS configuration.

The semiconductor devices can include any semiconductor circuitry to support operation of a memory structure to be subsequently formed, as described above. At least one dielectric layer is formed over the semiconductor devices, which is herein referred to as at least one lower level dielectric layer (160, 170, 180). The at least one lower level dielectric layer (160, 170, 180) can include, for example, an optional dielectric liner 160 such as a silicon nitride liner that blocks diffusion of mobile ions and/or apply appropriate stress to underlying structures, a planarization dielectric layer 170 that is employed to provide a planar surface that is coplanar with the topmost surface of the dielectric liner 160 or the topmost surfaces of the gate structures (150, 152, 158), and an optional planar liner 180.

The semiconductor devices are formed in a peripheral device region 700. In one embodiment, regions in which memory stack structures and word line contact via structures are to be subsequently formed can remain free of semiconductor devices.

Device contact via structures 281 can be formed through the at least one lower level dielectric layer (160, 170, 180). The device contact via structures 281 can contact various semiconductor material portions in the substrate semiconductor layer 9. In one embodiment, the device contact via structures 281 can include source electrodes and drain electrodes which contact the respective source regions and drain regions of the field effect transistors.

In one embodiment, the planar liner 180 can include silicon nitride. The thickness of the planar liner 180 can be in a range from 2 nm to 50 nm, although lesser and greater thicknesses can also be employed. In addition, a dielectric metal oxide etch stop layer 184L can be formed on the planar liner 180. The dielectric metal oxide etch stop layer 184L can include a dielectric metal oxide material such as aluminum oxide, hafnium oxide, lanthanum oxide, or combinations thereof. The thickness of the dielectric metal oxide etch stop layer 184L can be in a range from 2 nm to 20 nm, although lesser and greater thicknesses can also be employed.

Figure 13:
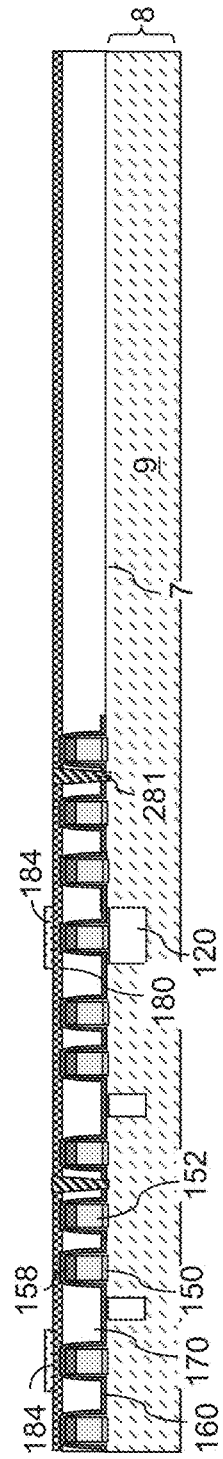
FIG. 13 is a vertical cross-sectional view of the second exemplary structure patterning the dielectric metal oxide etch stop layer according to the second embodiment of the present disclosure.

Referring to FIG. 13, the dielectric metal oxide etch stop layer 184L can be optionally patterned to form dielectric metal oxide etch stop portions 184. Patterning of the dielectric metal oxide etch stop layer 184L into the dielectric metal oxide etch stop portions 184 can be performed, for example, by applying a photoresist layer over the dielectric metal oxide etch stop layer 184L, patterning the photoresist layer to cover portions of the dielectric metal oxide etch stop layer 184L in areas in which through-peripheral-stack via structures to be subsequently formed, and removing physically exposed portions of the dielectric metal oxide etch stop layer 184L employing the patterned photoresist layer as an etch mask. An isotropic etch process (such as a wet etch process) or an anisotropic etch process can be employed to remove the physically exposed portions of the dielectric metal oxide etch stop layer 184L.

Optionally, the planar liner 180 may be patterned employing the photoresist layer and/or etch stop portions 184 as an etch mask, i.e., by removing portions of the planar liner 180 that are not covered by the photoresist layer to form bilayer (e.g., metal oxide and silicon nitride) etch stop portions. The photoresist layer can be subsequently removed, for example, by ashing. Each remaining portion of the dielectric metal oxide etch stop layer 184L constitutes the dielectric metal oxide etch stop portions 184.

Figure 14:
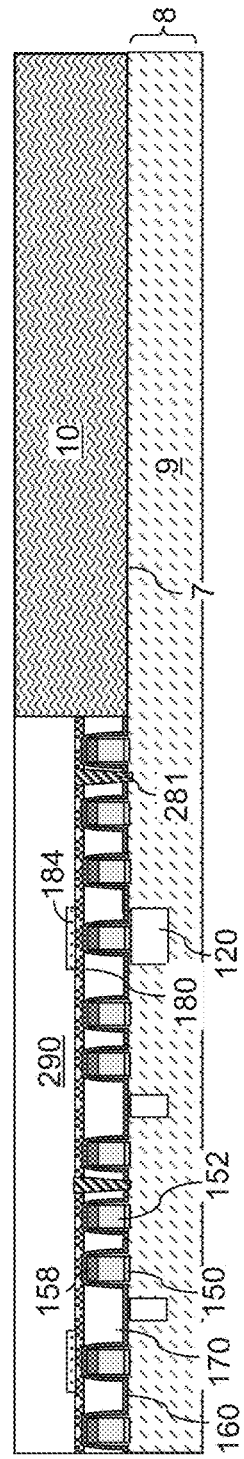
FIG. 14 is a vertical cross-sectional view of the second exemplary structure after deposition of a semiconductor material layer according to the second embodiment of the present disclosure.

Referring to FIG. 14, an optional additional lower level dielectric layer 290 can be formed over the planar liner 180 and the dielectric metal oxide etch stop portions 184. The optional additional lower level dielectric layer 290 includes a dielectric material such as silicon oxide. A masking layer (not shown), such as a patterned photoresist layer, can be formed over the peripheral devices in the peripheral device region 700, while not covering areas outside of the peripheral device region 700. Portions of the at least one lower level dielectric layer (160, 170, 180, 290) that are not covered by the masking layer can be removed by at least one etch process, which can include, for example, at least one wet etch process. For example, silicon oxide in the at least one lower level dielectric layer (160, 170, 180, 290) can be removed by a wet etch process employing hydrofluoric acid, and silicon nitride in the at least one lower level dielectric layer (160, 170, 180, 290) can be removed by a wet etch process employing hot phosphoric acid. A top surface of the substrate semiconductor layer 9, such as the major surface 7, can be physically exposed in areas that are not covered by the masking layer. The masking layer can be subsequently removed, for example, by ashing.

An epitaxy process can be performed to form a planar semiconductor material layer 10 directly on the top surface of the substrate semiconductor layer 9. The epitaxy process can be a selective epitaxy process that grows a semiconductor material only from semiconductor surfaces, or can be a non-selective epitaxy process that grows a crystalline semiconductor material from crystalline semiconductor surfaces and amorphous or polycrystalline semiconductor material from amorphous surfaces of dielectric materials. If a non-selective epitaxy process is employed, a planarization process can be employed to remove portions of the deposited semiconductor material from above the top surface of the at least one lower level dielectric layer (160, 170, 180, 290).

The planar semiconductor material layer 10 includes a semiconductor material, which can include at least one elemental semiconductor material, at least one III-V compound semiconductor material, at least one II-VI compound semiconductor material, at least one organic semiconductor material, and/or other semiconductor materials known in the art. In one embodiment, the planar semiconductor material layer 10 can include a single crystalline semiconductor material in epitaxial alignment with the single crystalline structure of the semiconductor material in the substrate semiconductor layer 9. The planar semiconductor material layer 10 can be formed directly on the substrate semiconductor layer 9, and outside the area of the peripheral device region 700.

Alternatively, the planar semiconductor material layer 10 may be formed prior to formation of the CMOS devices. In this case, the semiconductor devices formed at the processing steps of FIG. 12 can be formed in a recessed region, and planarization of the topmost dielectric layer overlying the semiconductor devices (such as planarization of the lower level dielectric layer 290) can be performed such that the top surfaces of the topmost dielectric layer overlying the semiconductor devices is coplanar with the top surface of the planar semiconductor material layer 10.

Alternatively, the planar semiconductor material layer 10 may be omitted. In this case, a physical step may exist between the region including the semiconductor devices and the region that that does not include the semiconductor devices and in which the top surface of the substrate semiconductor layer 9 is physically included. In this case, the area immediately adjacent to the physical step may be employed as a transition region in which formation of additional semiconductor device is avoided.

Figure 15:
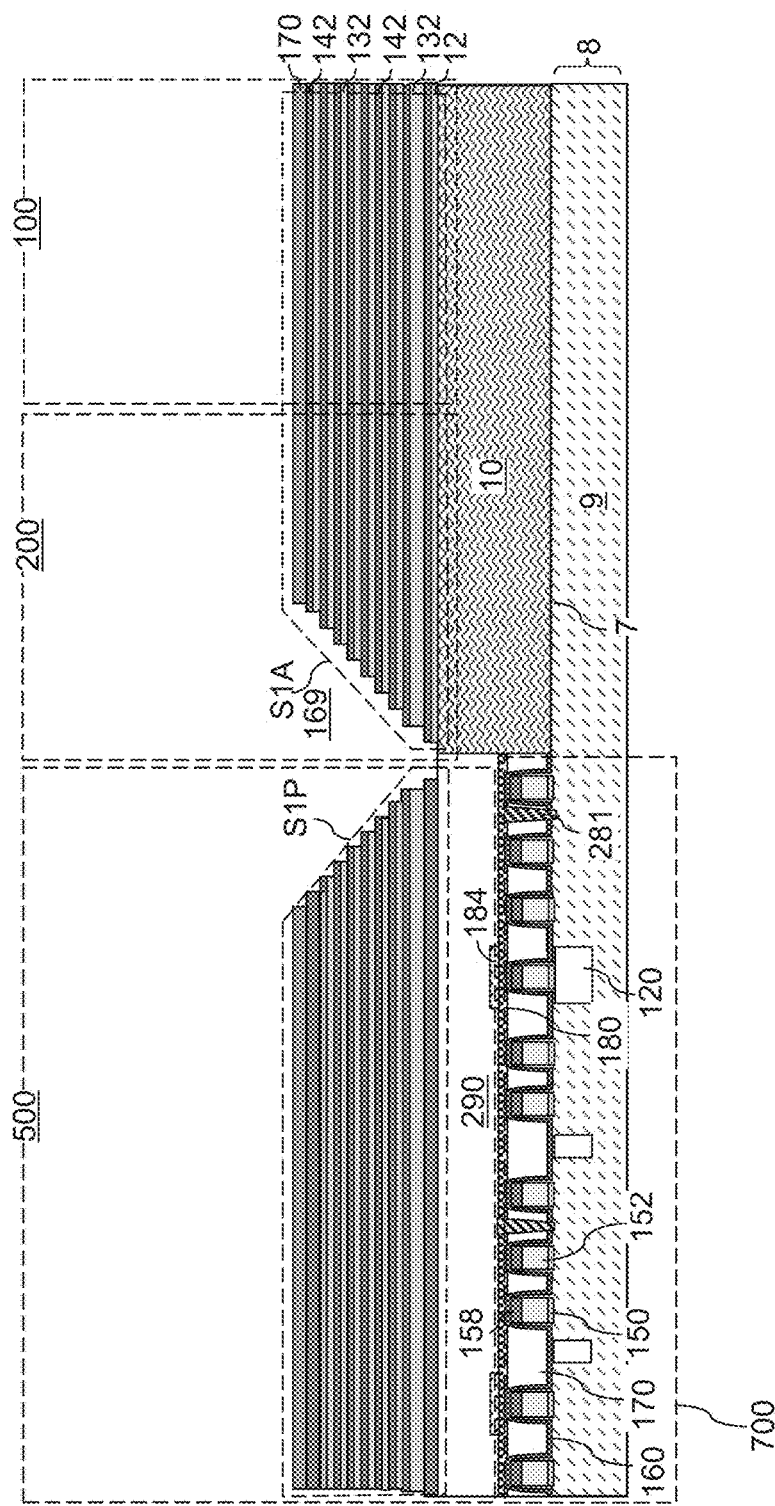
FIG. 15 is a vertical cross-sectional view of the second exemplary device structure after formation and patterning of a first alternating stack of first insulating layers and first spacer material layers according to a second embodiment of the present disclosure.

Referring to FIG. 15, the processing steps of FIG. 2C can be performed to form a dielectric pad layer 12, a first-tier alternating stack (132, 142), and a first insulating cap layer 170. Further, the first insulating cap layer 170 and the first-tier alternating stack (132, 142) can be patterned employing one or more masking layers and a series of etch processes to form a first retro-stepped cavity 169 along an interface between the word line contact via region 200 and the through-peripheral-stack via region 500.

As discussed above, first stepped terraces are formed on both sides of the interface between the through-peripheral-stack via region 500 and each word line contact via region 200 through the first-tier alternating stack (132, 142), thereby dividing the first-tier alternating stack (132, 142) into two physically disjoined portions. The portion of the first-tier alternating stack (132, 142) located within the memory array region 100 and the word line contact via region 200 is herein referred to as a first active alternating stack S1A. The portion of the first-tier alternating stack (132, 142) located within the through-peripheral-stack via region 500 is herein referred to as a first peripheral alternating stack S1P.

The first stepped terraces of the first active alternating stack S1A can be located in a portion of the word line contact via region 200 that adjoins the through-peripheral-stack via region 500. The first stepped terraces of the first active alternating stack S1A and the first stepped surfaces of the first peripheral alternating stack S1P collectively define the first retro-stepped cavity. In one embodiment, the first retro-stepped cavity can laterally isolate the first active alternating stack S1A from at least one first active peripheral alternating stack S1P. As discussed with respect to the first embodiment, there are no dummy staircases 200D facing the sense amplifier circuitry 704.

Figure 16:
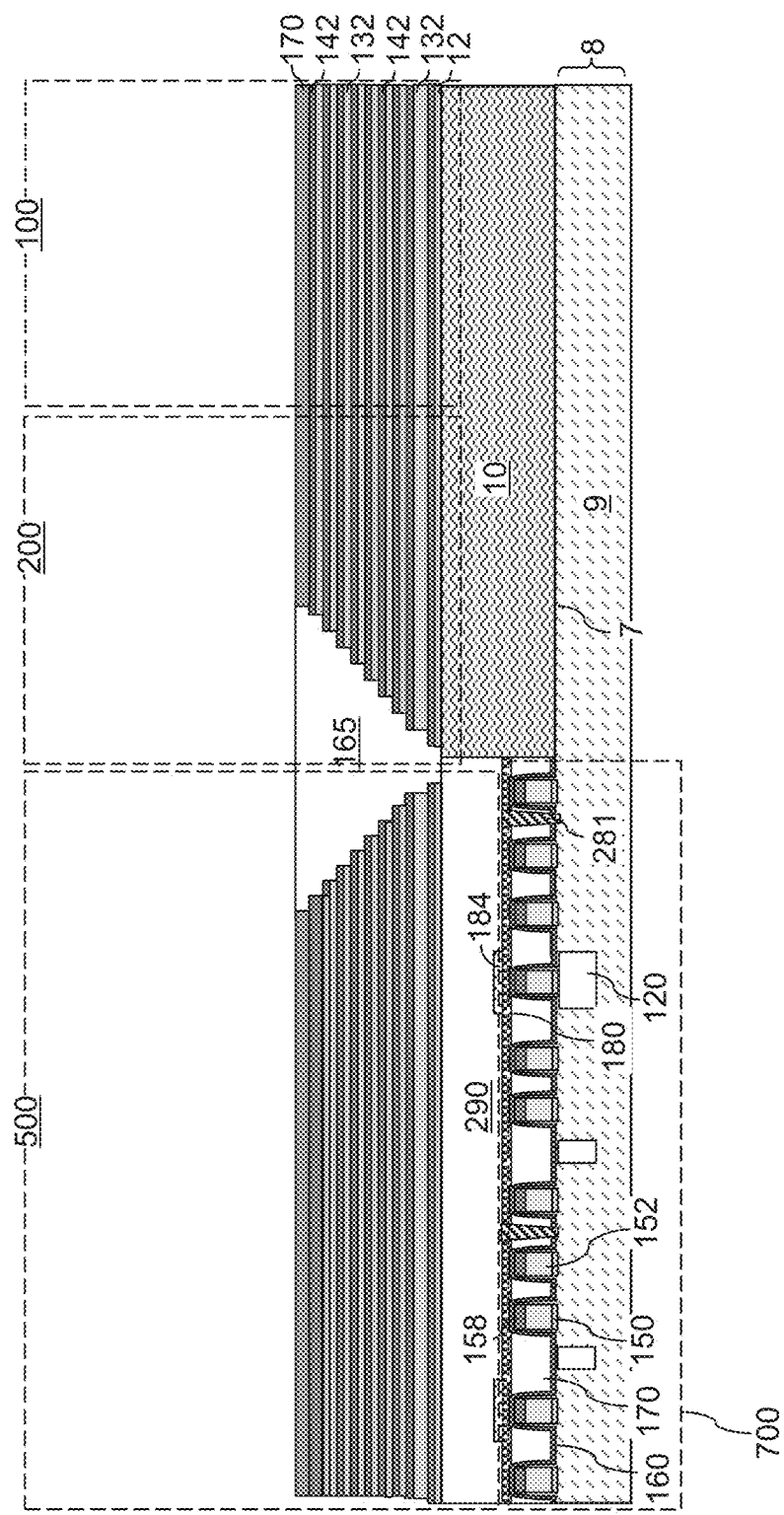
FIG. 16 is a vertical cross-sectional view of the second exemplary structure after formation of a first retro-stepped dielectric material portion according to the second embodiment of the present disclosure.

Referring to FIG. 16, the processing steps of FIG. 3 can be performed to remove the last masking layer, and to form a first retro-stepped dielectric material portion 165.

Figure 17:
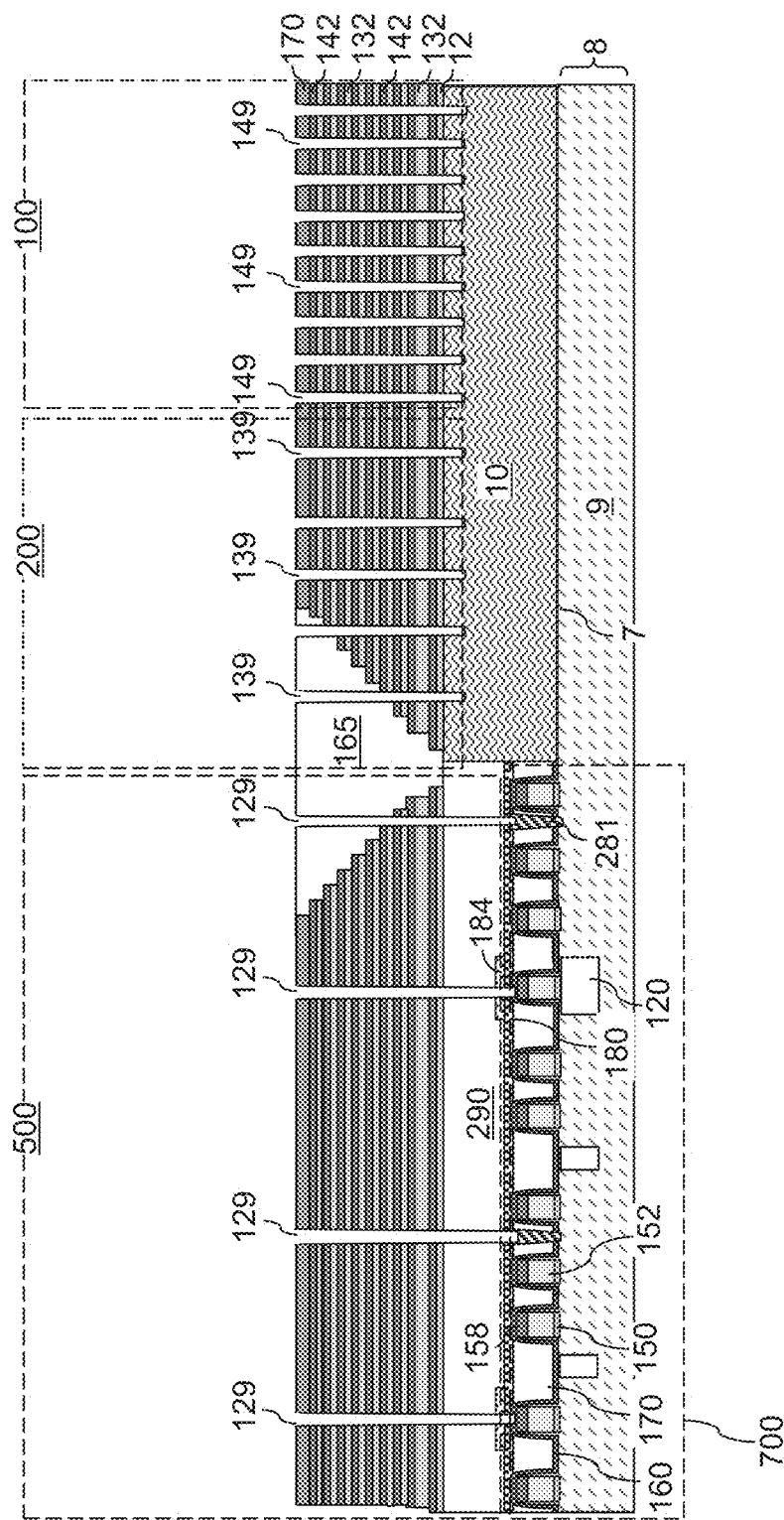
FIG. 17 is a vertical cross-sectional view of the second exemplary structure after formation of first memory openings and first peripheral via cavities according to the second embodiment of the present disclosure.

Referring FIG. 17, the processing steps of FIG. 4 can be performed to form first memory openings 149, optional first support openings 139, and first peripheral via cavities 129 in the memory array region 100, the word line contact via region 200, and the through-peripheral-stack via region 500, respectively. The first memory openings 149, the optional first support openings 139, and the first peripheral via cavities 129 can be formed by applying and patterning a photoresist layer (not shown) over the first tier structure (132, 142, 170, 165), and transferring the pattern of openings in the photoresist layer through the first tier structure (132, 142, 170, 165) and into underlying material portions employing an anisotropic etch process.

The first memory openings 149 are formed in areas in which memory stack structures are subsequently formed to provide a three-dimensional array of memory elements. The first support openings 139 are formed in areas in which dummy memory stack structures that are not electrically connected are to be subsequently formed to provide structural support during replacement of the first sacrificial material layers 142 with first electrically conductive layers.

As discussed above, the chemistry of the anisotropic etch process can be selected such that the etch rate depends on the accessibility of the reactive ions to the bottom of cavities that are formed through the first tier structure (132, 142, 170, 165). In this case, the etch rate for the first peripheral via cavities 129 can be greater than the etch rate for the first memory openings 149 and the first support openings 139. Consequently, the depth of the first peripheral via cavities 129 can be greater than the depths of the first memory openings 149 and optional first support openings 139.

The first peripheral via cavities 129 are formed though the first peripheral alternating stack S1P. Optionally at least one of the first peripheral via cavities 129 can be formed though the first peripheral alternating stack S1P and the first retro-stepped dielectric material portion 165. The first memory openings 149 are formed through the first active alternating stack S1A. The first support openings 139 are formed through the first active alternating stack S1A and the first retro-stepped dielectric material portion 165. The first memory openings 149 and the first support openings 139 can be formed through the first active alternating stack S1A concurrently with formation of the first peripheral via cavities 129 through the first peripheral alternating stack SIP.

The first peripheral via cavities 129 are formed in areas in which the dielectric metal oxide etch stop portions 184 are present, or the device contact via structures 281 are present. In the second embodiment, the first peripheral via cavities 129 can be formed by an anisotropic etch process that employs the dielectric metal oxide etch stop portions 184 (which are remaining portions of the dielectric metal oxide etch stop layer 184L) as etch stop structures instead of the lower level metal interconnect structures 28 that are employed as etch stop structures in the first embodiment. Once the dielectric metal oxide etch stop portions 184 are etched through, the underlying portions of the planar liner 180 and any dielectric material portion underneath can be subsequently etched through as well. A top surface of a conductive element of a node of a semiconductor device can be physically exposed at bottom portions of each first peripheral via cavity 129 within a first subset of first peripheral via cavities 129. A top surface of a device contact via structures 281 can be physically exposed at bottom portions of each first peripheral via cavity 129 within a second subset of first peripheral via cavities 129. Each of the first peripheral via cavities 129 are formed in volumes in which through-peripheral-stack via structures are to be subsequently formed to provide vertically conductive paths that connect physically exposed nodes of the semiconductor devices or to connect physically exposed device contact via structures 281 to upper level metal interconnect structures to be subsequently formed above the first tier structure.

Figure 18:
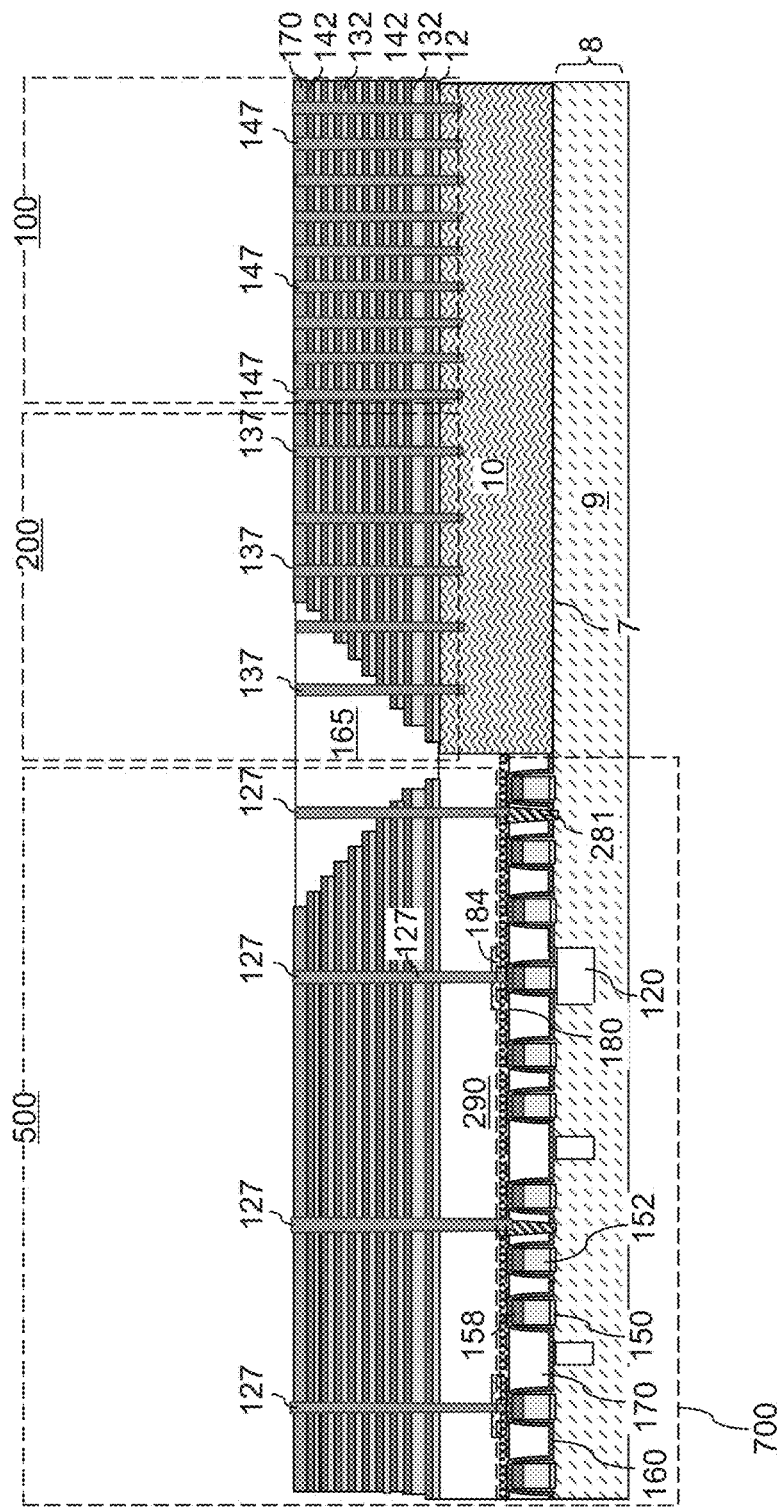
FIG. 18 is a vertical cross-sectional view of the second exemplary structure after formation of sacrificial memory opening fill structures and sacrificial via fill structures according to the second embodiment of the present disclosure.

Referring to FIG. 18, the processing steps of FIG. 5 can be performed to simultaneously form sacrificial memory opening fill structures 147, sacrificial support opening fill structures 137, and sacrificial via fill structures 127 in the first memory openings 149, in the first support openings 139, and in the first peripheral via cavities 129, respectively.

Figure 19:
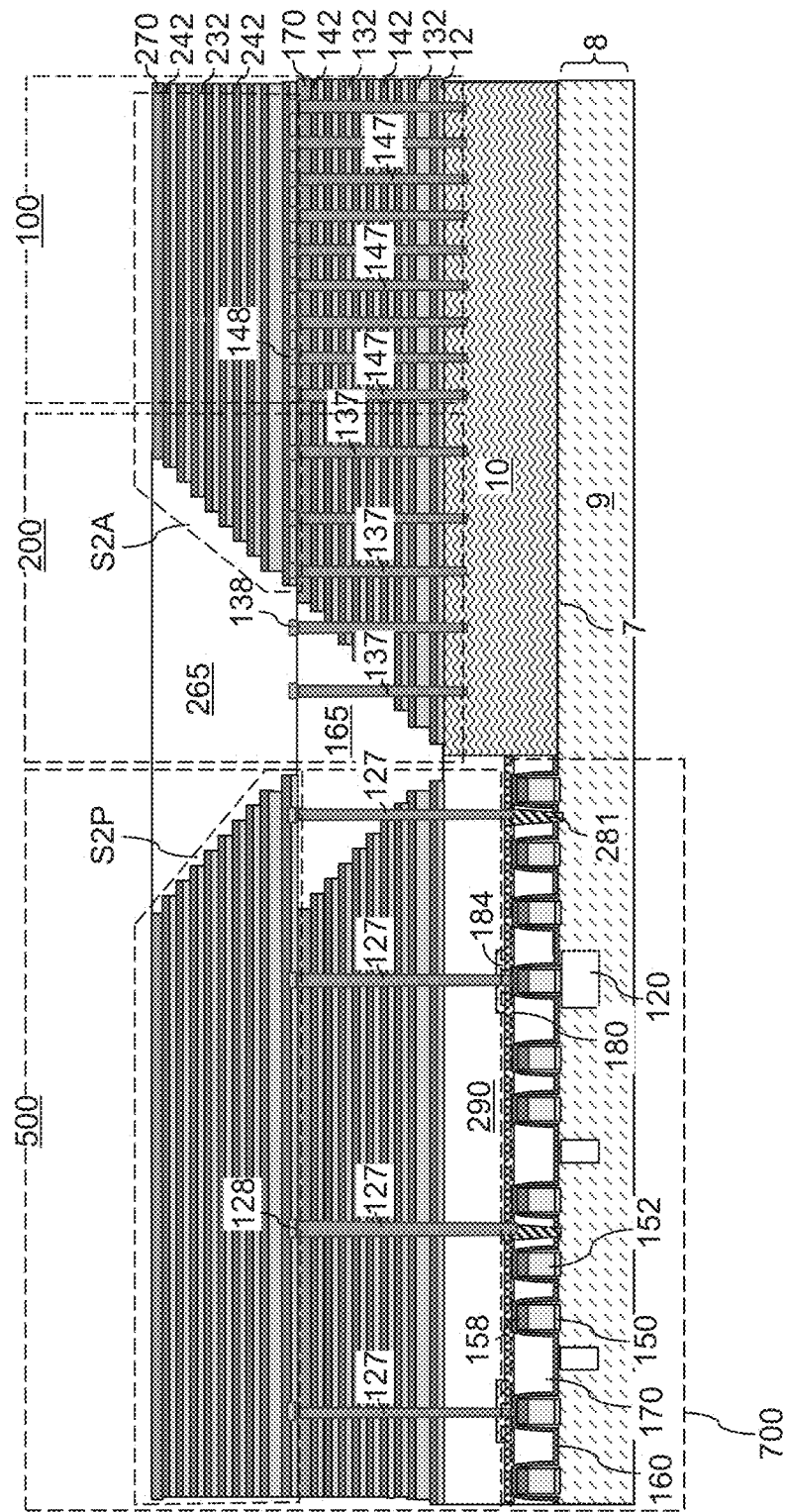
FIG. 19 is a vertical cross-sectional view of the second exemplary structure after formation of a second tier structure including patterned portions of an alternating stack of second insulating layers and second spacer material layers and a second retro-stepped dielectric material portion according to the second embodiment of the present disclosure.

Referring to FIG. 19, a second tier structure (232, 242, 270, 265) can be formed over the first tier structure (132, 142, 170, 165) by performing the processing steps of FIG. 6. A second-tier alternating stack (232, 242) (which includes the second active alternating stack S2A and the second peripheral alternating stack S2P), a second insulating cap layer 270, and a second-tier retro-stepped dielectric material portion 265 collectively constitute a second tier structure, which is an in-process structure that is subsequently modified. Each of the second active alternating stack S2A and the second peripheral alternating stack S2P comprises an alternating stack of second insulating layers 232 and second spacer material layers 242 patterned to provide respective second stepped terraces. A second retro-stepped dielectric material portion 265 is located in the second tier structure (232, 242, 270, 265) and overlies, and contacts, second stepped terraces of the second active alternating stack S2A and the second peripheral alternating stack S2P. The second active alternating stack S2A overlies the first active alternating stack S1A, and the second peripheral alternating stack S2P overlies the first peripheral alternating stack S1P. As discussed with respect to the first embodiment, there are no dummy staircases 200D facing the sense amplifier circuitry 704.

Figure 20:
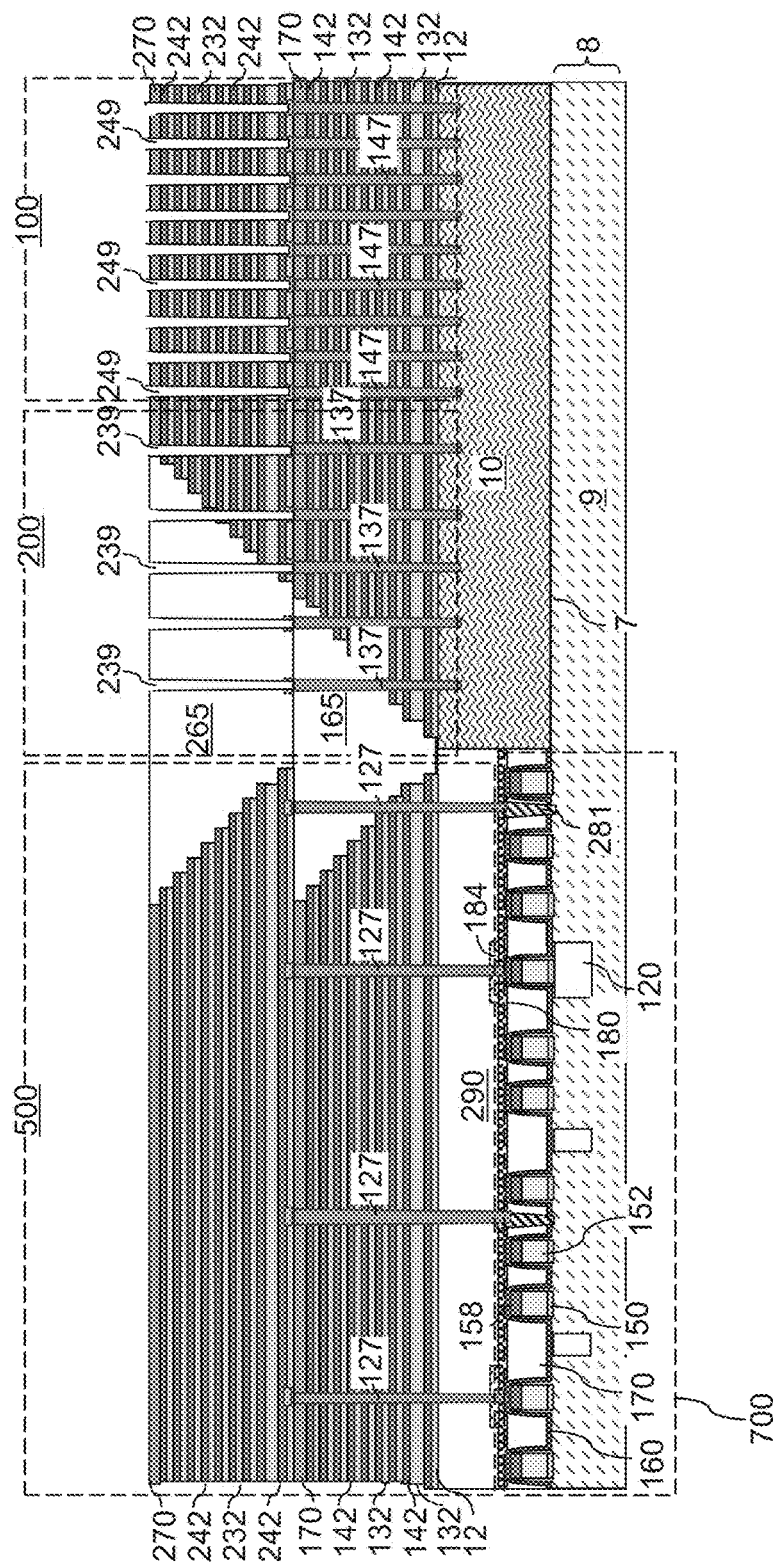
FIG. 20 is a vertical cross-sectional view of the second exemplary structure after formation of second memory openings according to the second embodiment of the present disclosure.

Referring to FIG. 20, the processing steps of FIG. 7 can be performed to form second memory openings 249 and second support openings 239 in the memory array region 100 and the word line contact via region 200, respectively.

Figure 21:
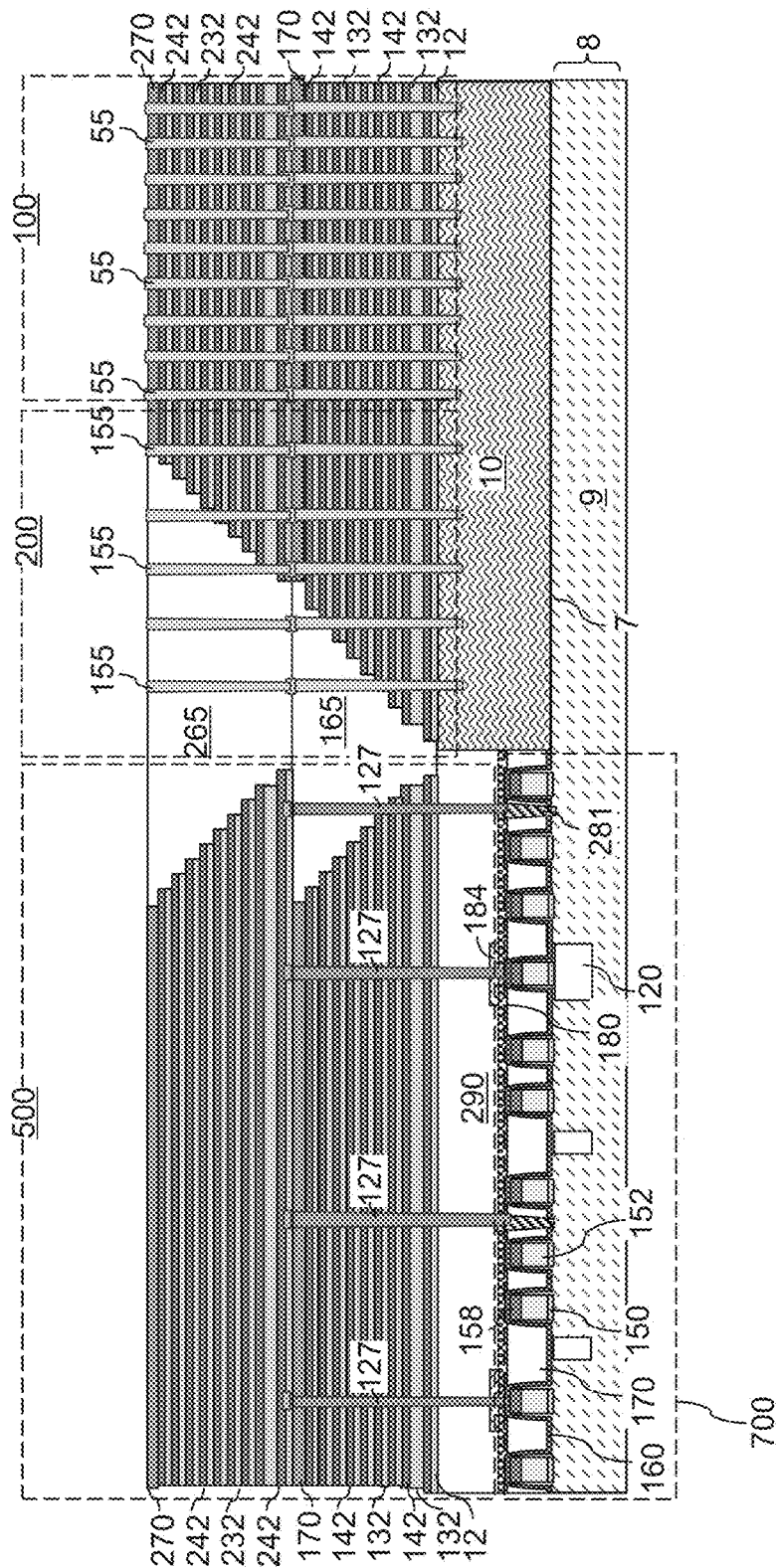
FIG. 21 is a vertical cross-sectional view of the second exemplary structure after formation of memory stack structures according to the second embodiment of the present disclosure.

Referring to FIG. 21, the processing steps of FIG. 8 can be performed to simultaneously form memory stack structures 55 and support pillar structures 155.

Figure 22:
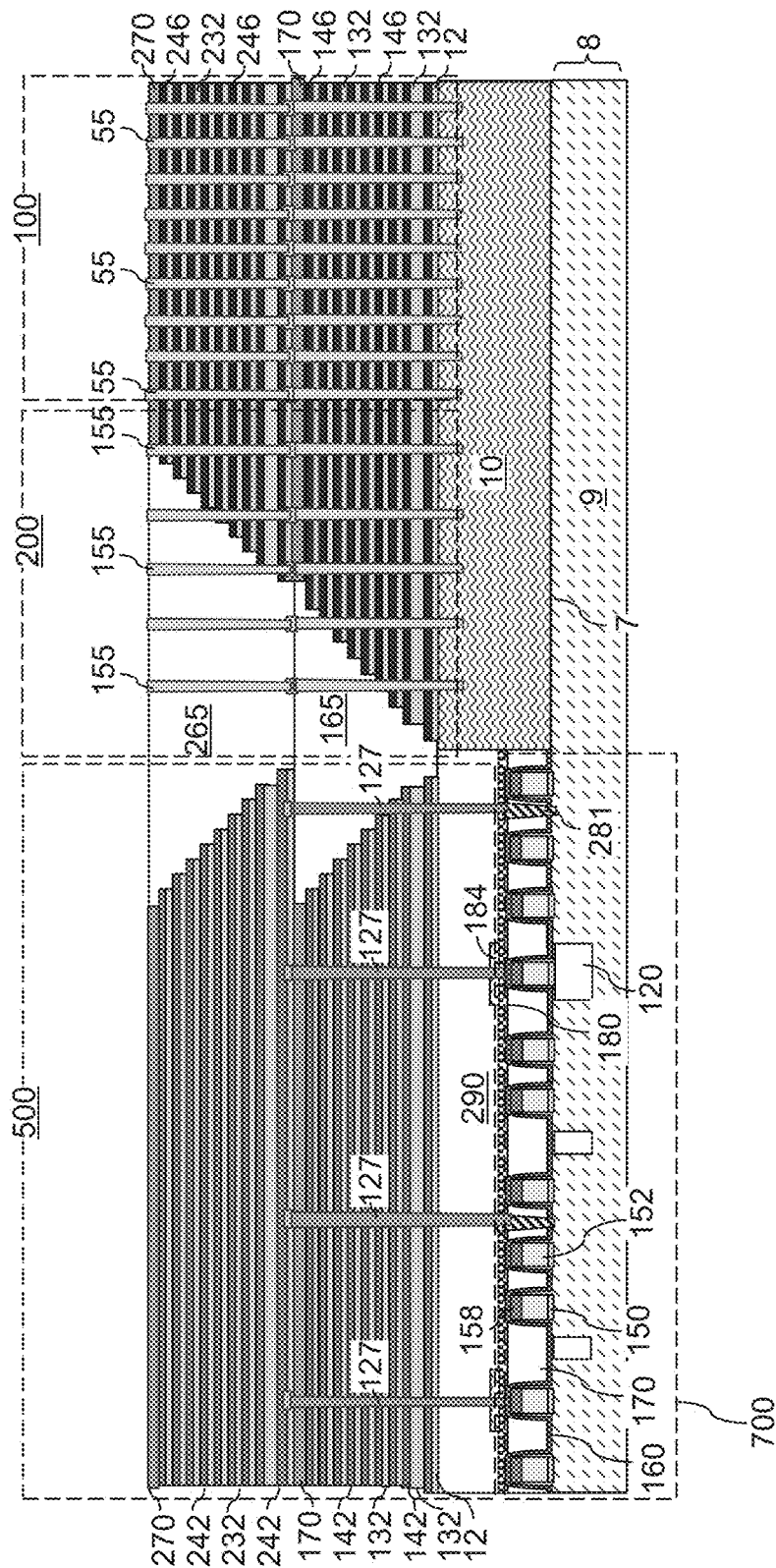
FIG. 22 is a vertical cross-sectional view of the second exemplary structure after replacement of sacrificial material layers in active alternating stacks with electrically conductive layers according to the second embodiment of the present disclosure.

Referring to FIG. 22, the processing steps of FIG. 9 can be performed to replace the sacrificial material layers (142, 242) in the first and second active alternating stacks (S1A, S2A) with first electrically conductive layers 146 and second electrically conductive layers 246, respectively. However, the spacer material layers (142, 242) in the peripheral alternating stacks (S1P, S2P) are not replaced because the trenches 79 do not extend to region 500.

Figure 23:
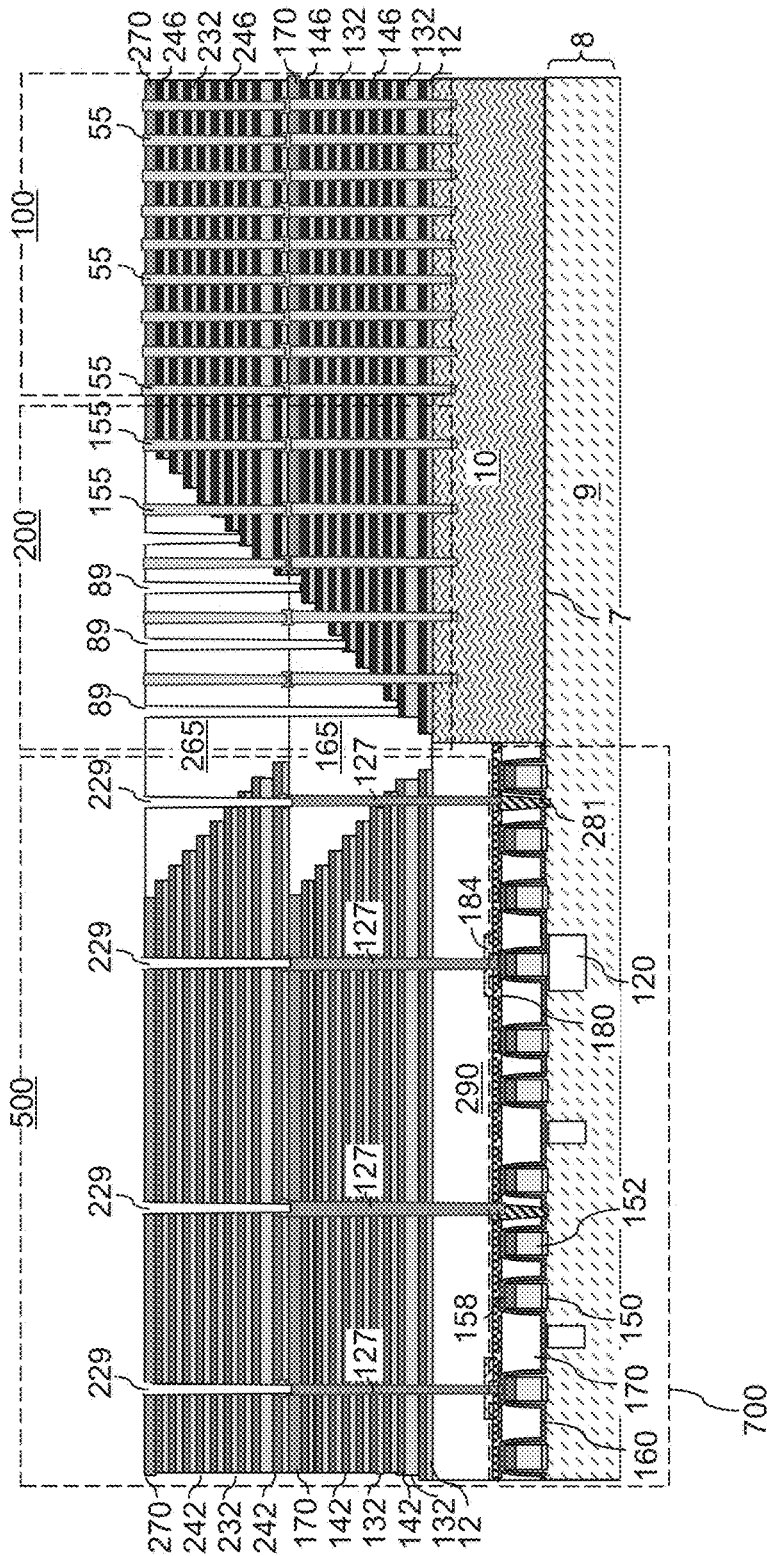
FIG. 23 is a vertical cross-sectional view of the second exemplary structure after concurrently forming second peripheral via cavities and word line contact via cavities according to the second embodiment of the present disclosure.

Referring to FIG. 23, the processing steps of FIG. 10 can be performed to simultaneously form word line contact via cavities 89 and second peripheral via cavities 229. The word line contact via cavities 89 extend from the top surface of the second retro-stepped dielectric material portion 265 to a respective top surfaces of the electrically conductive layers (146, 246), which include horizontal surfaces of the first stepped surfaces of the first active alternating stack S1A and horizontal surfaces of the second stepped surfaces of the second active alternating stack S2A. The second peripheral via cavities 229 extend from the top surface of the second peripheral alternating stack S2P or from the top surface of the second retro-stepped dielectric material portion 265 to a top surfaces of a respective sacrificial via fill structures 127. In one embodiment, the word line contact via cavities 89 and the second peripheral via cavities 229 can be formed concurrently employing a same anisotropic etch process and a same patterned photoresist layer.

Figure 24:
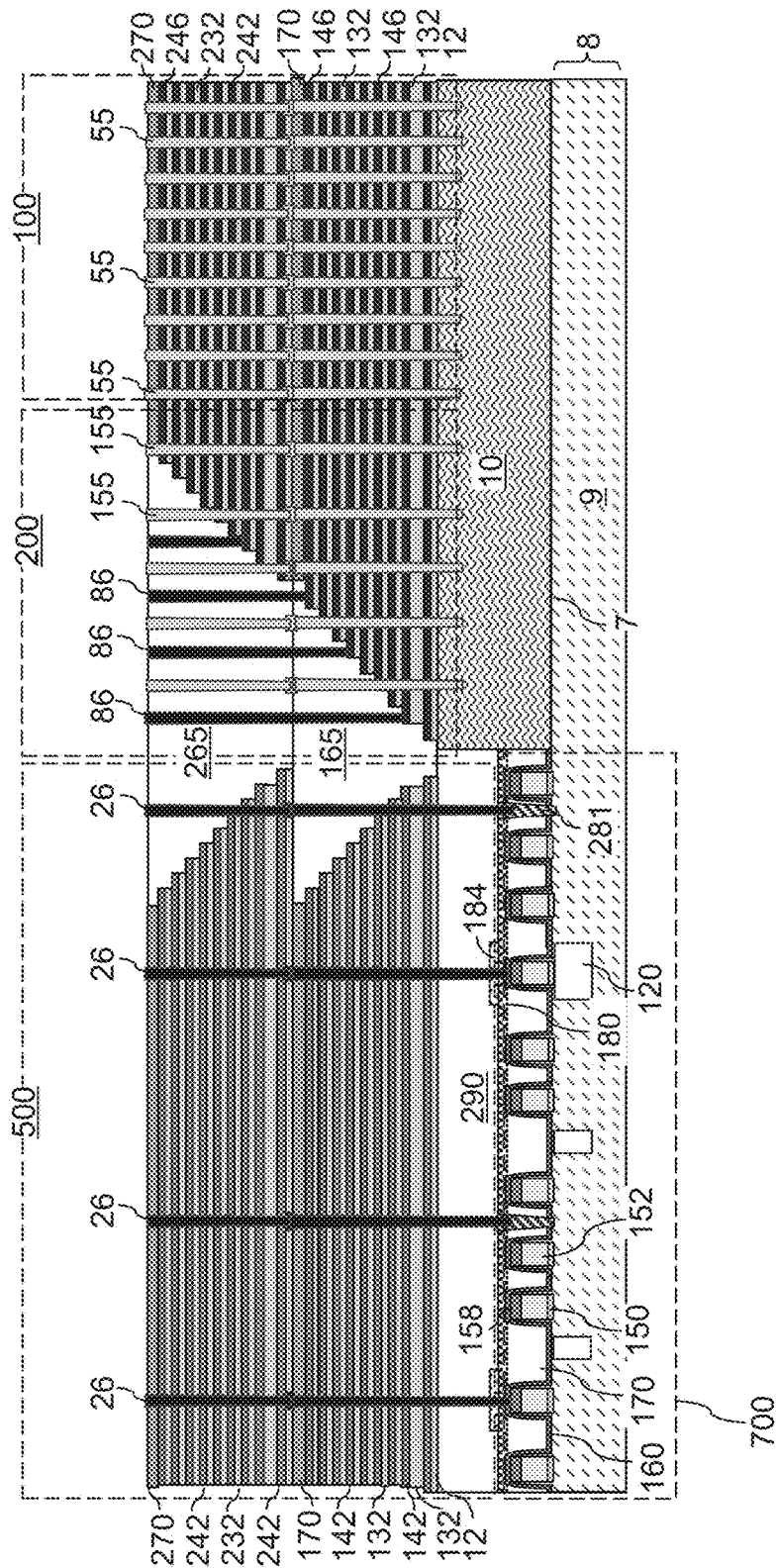
FIG. 24 is a vertical cross-sectional view of the second exemplary structure after formation of peripheral via structures and word line contact via structures according to the second embodiment of the present disclosure.

Referring to FIG. 24, the processing steps of FIG. 11 can be performed to form through-peripheral-stack via cavities. A top surface of an element of a node of a semiconductor device or a top surface of a device contact via structures 281 can be physically exposed at the bottom of each through-peripheral-stack via cavity.

At least one conductive material is deposited in the through-peripheral-stack via cavities and in the word line contact via cavities 89. For example, the at least one conductive material can include a conductive metallic nitride (such as TiN) and at least one metal (such as W, Al, Cu, or Co or a combination or an alloy thereof). Excess portions of the at least conductive material can be removed from above the top surface of the second tier structure (232, 242, 246, 270, 265) by a planarization process, which can employ a recess etch or chemical mechanical planarization (CMP).

Each remaining portion of the at least one conductive material in the through-peripheral-stack via cavities constitutes a peripheral via structure 26. Each remaining portion of the at least one conductive material in the word line contact via cavities 89 constitutes a word line contact via structure 86.

FIG. 25 is a vertical cross-sectional view of a close up of the first exemplary structure along line A-A' in FIG. 1. The second exemplary structure can have a similar configuration. The field effect transistors can include active regions 130, which include source regions and drain regions. A planar dielectric portion 182 (e.g., part of layer 180) and a dielectric metal oxide etch stop portion 184 can be patterned on a top surface of an active region 130, and can be employed as an etch stop structure during formation of a first peripheral via cavity.

A pedestal channel portion 11 can be provided at the bottom of each inter-tier memory opening and each inter-tier support opening as discussed above. Each memory stack structure 55 and each support pillar structure 155 can include a memory film 50 at a periphery, and a vertical semiconductor channel 60 contacting an inner sidewall of the memory film 50. Each memory film 50 can include, from outside to inside, an optional blocking dielectric layer, a memory material layer, and a tunneling dielectric layer. Each vertical semiconductor channel 60 can include an outer semiconductor channel layer 601 and an inner semiconductor channel layer 602. A dielectric core 62 may be provided within each vertical semiconductor channel 60. A drain region 63 can be provided at a top end of each vertical semiconductor channel 60. A source region 61 can be provided at the bottom of each backside contact trench 79, which can be filled with an insulating spacer 74 and a backside contact via structure 76 (e.g., source local interconnect or electrode).

At least one upper level dielectric layer 90 can be formed over the second tier structure (232, 242, 246, 265, 270) of the various exemplary structures of the present disclosure. Various upper level metal interconnect structures (93, 96, 97, 98) can be formed in the at least one upper level dielectric layer 90. The various upper level metal interconnect structures (93, 96, 97, 98) can be metal line structures, metal via structures, or combinations of at least one metal line structure and at least one metal via structure. The various upper level metal interconnect structures (93, 96, 97, 98) can include, for example, an upper level peripheral metal interconnect structure 93 contacting a peripheral via structure 26, upper level word line interconnect structures 96 contacting word line contact via structures 86, an upper level source interconnect structure 97 (e.g., source line or shunt line) contacting a backside contact via structure 76, and upper level memory array interconnect structures 98 contacting the drain regions 63 in the array of memory stack structures 55. There are no electrical contacts to the top of the dummy memory stack structures 155 described above.

The various exemplary structures of the present disclosure can include a three-dimensional memory device. The three-dimensional memory device includes peripheral devices located on a top surface of a substrate semiconductor layer 9 and a first tier structure (132, 142, 146, 170, 165) including a first active alternating stack (132, 146) and a first peripheral alternating stack (132, 142) and located over the substrate semiconductor layer 9. At least the first peripheral alternating stack (132, 142) overlies the peripheral devices. The first active alternating stack (132, 146) comprises an alternating sequence of first electrically conductive layers 146 and first portions of first insulating layers 132, and the first peripheral alternating stack (132, 142) comprises an alternating sequence of first spacer material layers 142 and second portions of the first insulating layers 132. A second tier structure (232, 242, 246, 270, 265) includes a second active alternating stack (232, 246) and a second peripheral alternating stack (232, 242) and is located over the first tier structure (132, 142, 146, 170, 165). The second active alternating stack (232, 246) comprises an alternating sequence of second electrically conductive layers 246 and first portions of second insulating layers 232, and the second peripheral alternating stack (232, 242) comprises an alternating sequence of second spacer material layers 242 and second portions of the second insulating layers 232. Memory stack structures 55 extend through the first active alternating stack (132, 146) and the second active alternating stack (232, 246). Word line contact via structures 86 vertically extend to a top surface of the electrically conductive layers (146, 246). Peripheral via structures 26 extend through the first and second peripheral alternating stacks and contacting components of the peripheral devices. The spacer material layers comprise a different material, such as a dielectric material (e.g., silicon nitride) from the electrically conductive layers.

In one embodiment, the three-dimensional memory device can further include a first retro-stepped dielectric material portion 165 located in the first tier structure (132, 142, 146, 170, 165) and overlying first stepped terraces of the first active alternating stack (132, 146) and the first peripheral alternating stack (132, 142); and a second retro-stepped dielectric material portion 265 located in the second tier structure (232, 242, 246, 270, 265) and overlying second stepped terraces of the second active alternating stack (232, 246) and the second peripheral alternating stack (232, 242). The second stepped terraces of the second peripheral alternating stack (232, 242) can overlie an area of the first stepped terraces of the first peripheral alternating stack (132, 142). In other words, portion 165 is located under the second peripheral alternating stack in second tier structure in the overhang region 266 shown in FIG. 11. The second stepped terraces of the second active alternating stack (232, 246) can be located outside an entire area of the first stepped terraces of the first active alternating stack (132, 146).

At least one of the peripheral via structures 26 can extend through the second retro-stepped dielectric portion 265, a portion of the second peripheral alternating stack (232, 242), the first retro-stepped dielectric portion 165, and a portion of the first peripheral alternating stack (132, 142).

In one embodiment, at least one of the peripheral via structures 26 can include a first tapered sidewall extending from a top surface of the first peripheral alternating stack (132, 142) of the first tier structure (132, 142, 146, 170, 165) to a component of one of the peripheral devices, a second tapered sidewall extending through the second peripheral alternating stack (232, 242) of the second tier structure (232, 242, 246, 270, 265), and an annular horizontal surface 26A extending between a top periphery of the first tapered sidewall and a bottom periphery of the second tapered sidewall. The first and second tapered sidewalls can be formed in separate processing steps during formation of a first peripheral via cavity 129 and a second peripheral via cavity 229. The annular horizontal surface can be formed if the bottom surface of the second peripheral via cavity 229 is narrower than the top surface of the first peripheral via cavity 129. Thus, a horizontal step is formed between the first and second tapered sidewalls of one, or more, or all, of the peripheral via structures 26. The surface 26A at the step may be the top surface of the landing pad area, or the top part of the first tapered sidewall which is wider than a bottom part of the overlying second tapered sidewall (if the landing pad is omitted). The semiconductor material layer 10 is located above the level of the peripheral devices and underneath the first tier structure (132, 142, 146, 170, 165).

In some embodiments, lower level metal interconnect structures 28 can be embedded in at least lower level dielectric layer (160, 170, 180, 190), and can be located over, and electrically connected to, the peripheral devices. The lower level metal interconnect structures 28 can underlie the semiconductor material layer 10 as shown in FIG. 11 or can be located on the side of the semiconductor material layer 10 as shown in FIG. 24. The peripheral via structures 26 can contact top surfaces of the lower level metal interconnect structures 28.

In one embodiment, the semiconductor material layer 10 can be located on a top surface of the substrate semiconductor layer 9 in a region in which the peripheral devices are not present. At least one of the peripheral via structures 26 can extend through a portion of a dielectric metal oxide etch stop layer 184L and can contact a top surface of a respective component of the peripheral devices.

Each of the memory stack structures 55 and support pillar structures 155 can include: a vertical stack of memory elements located at each level of the first and second electrically conductive layer (146, 246) which is at the same level as a level of a respective spacer material layers (142, 242); a tunneling dielectric layer (located in a memory film 50) vertically extending through the first and second active alternating stacks of the first and second tier structures; and a vertical semiconductor channel 60 located on the tunneling dielectric layer and extending through the first and second active alternating stacks of the first and second tier structures.

The memory devices of the present disclosure comprise an alternating stack of insulating layers (132, 232) and electrically conductive layers (146, 246) located over a substrate 8, and an array of memory stack structures 55 extending through the alternating stack (132, 146, 232, 246). Each of the memory stack structures 55 comprises charge storage regions (as embodied as portion of a respective memory film 50) and a vertical semiconductor channel 60. The electrically conductive layers (146, 246) comprise word lines for the memory stack structures 55.

In one embodiment, the array of memory stack structures 55 can comprise memory elements of a vertical NAND device, the electrically conductive layers (146, 246) can comprise, or are electrically connected to, a respective word line of the vertical NAND device, the substrate semiconductor layer 9 can comprises a silicon substrate, and the vertical NAND device can comprise an array of monolithic three-dimensional NAND strings over the silicon substrate. At least one memory cell in a first device level of the array of monolithic three-dimensional NAND strings is located over another memory cell in a second device level of the array of monolithic three-dimensional NAND strings. The silicon substrate can contain an integrated circuit comprising the word line driver circuit and a bit line driver circuit for the memory device. The array of monolithic three-dimensional NAND strings can comprise a plurality of semiconductor channels. At least one end portion (such as a respective vertical semiconductor channel 60) of each of the plurality of semiconductor channels extends substantially perpendicular to a top surface of the substrate semiconductor layer 9. The array of monolithic three-dimensional NAND strings can comprise a plurality of charge storage elements (as embodied as portions of the memory film 50). Each charge storage element can be located adjacent to a respective one of the plurality of semiconductor channel. The array of monolithic three-dimensional NAND strings can comprise a plurality of control gate electrodes having a strip shape extending substantially parallel to the top surface of the substrate semiconductor layer 9. The plurality of control gate electrodes comprise at least a first control gate electrode located in the first device level and a second control gate electrode located in the second device level.

Although the foregoing refers to particular embodiments, it will be understood that the disclosure is not so limited. It will occur to those of ordinary skill in the art that various modifications may be made to the disclosed embodiments and that such modifications are intended to be within the scope of the disclosure. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A method of forming a semiconductor structure, comprising:
    forming peripheral devices on a semiconductor substrate;
    forming a first tier structure including a first active alternating stack and a first peripheral alternating stack over the semiconductor substrate, wherein at least the first peripheral alternating stack overlies the peripheral devices, and each of the first active alternating stack and the first peripheral alternating stack comprises an alternating stack of first insulating layers and first spacer material layers patterned to provide respective first stepped terraces;
    forming first peripheral via cavities through the first peripheral alternating stack;
    filling the first peripheral via cavities with sacrificial via fill structures;
    forming a second tier structure including a second active alternating stack and a second peripheral alternating stack over the first tier structure, wherein each of the second active alternating stack and the second peripheral alternating stack comprises an alternating stack of second insulating layers and second spacer material layers patterned to provide respective second stepped terraces, the second active alternating stack overlies the first active alternating stack, and the second peripheral alternating stack overlies the first peripheral alternating stack;
    replacing at least a portion of the first and second spacer material layers in the first and second active alternating stacks with electrically conductive layers; and
    concurrently forming second peripheral via cavities extending to the peripheral via fill structures through the second peripheral alternating stack and word line contact via cavities extending to the electrically conductive layers in the first and second active alternating stacks.

2. The method of claim 1, further comprising:
    removing the sacrificial via fill structures; and
    concurrently forming peripheral via structures in volumes of the first and second peripheral via cavities and word line contact via structures in the word line contact via cavities.

3. The method of claim 1, wherein replacement of the portions of the first and second spacer material layers in the first and second active alternating stacks with the electrically conductive layers is performed without removing portions of the first and second spacer material layers in the first and second peripheral alternating stacks.

4. The method of claim 3, wherein the first and second spacer material layers comprise a dielectric material different from materials of the first and second insulating layers.

5. The method of claim 1, further comprising forming a semiconductor material layer above a level of the peripheral devices, wherein the first tier structure is formed over the semiconductor material layer.

6. The method of claim 5, further comprising forming lower level metal interconnect structures embedded in at least lower level dielectric layer over the peripheral devices, wherein the semiconductor material layer is formed on the at least one lower level dielectric layer, wherein the first peripheral via cavities are formed by an anisotropic etch process that employs a subset of the lower level metal interconnect structures as an etch stop structure.

7. The method of claim 5, wherein the semiconductor material layer is formed on a top surface of the semiconductor substrate in a region in which the peripheral devices are not present.

8. The method of claim 7, further comprising forming a dielectric metal oxide etch stop layer over the peripheral devices, wherein the first peripheral via cavities are formed by an anisotropic etch process that employs a portion of the dielectric metal oxide etch stop layer as an etch stop structure.

9. The method of claim 1, wherein:
    the second stepped terraces of the second peripheral alternating stack overlie an area of the first stepped terraces of the first peripheral alternating stack; and
    the second stepped terraces of the second active alternating stack are located outside an entire area of the first stepped terraces of the first active alternating stack.

10. The method of claim 1, further comprising:
    forming first memory openings through the first active alternating stack concurrently with formation of the first peripheral via cavities; and
    forming sacrificial memory opening fill structures in the first memory openings concurrently with formation of sacrificial via fill structures.

11. The method of claim 10, further comprising:
    forming second memory openings through the second active alternating stack and over the sacrificial memory opening fill structures;
    removing the sacrificial memory opening fill structures; and
    forming memory stack structures in volumes of the first and second memory openings;
    wherein there are no memory stack structures located in the first and the second peripheral alternating stacks; and
    wherein each of the memory stack structures comprises:
        a vertical stack of memory elements located at each level of the first and second electrically conductive layers;
        a tunneling dielectric layer vertically extending through the first and second active alternating stacks; and
        a vertical semiconductor channel located on the tunneling dielectric layer and extending through the first and second active alternating stacks.

12. The method of claim 1, wherein:
    the first active alternating stack of first insulating layers and first spacer material layers is patterned using a mask which exposes only a region of the respective first stepped terraces on two opposing sides of the first tier structure facing a portion of the peripheral devices which comprise word line decoder circuitry; and
    no stepped terraces are formed on additional sides of the first tier structure facing a portion of the peripheral devices which comprise bit line decoder circuitry.

13. The method of claim 12, wherein the first and second electrically conductive layers of the respective first and second active alternating stacks contact respective first and second spacer material layers of the respective first and second peripheral alternating stacks in an area of the first and second active alternating stacks facing the portion of the peripheral devices which comprise the bit line decoder circuitry.

14. The method of claim 1, wherein:
- the semiconductor device is a monolithic three-dimensional memory device comprising a vertical NAND device located over the semiconductor substrate;
- the electrically conductive layers comprise, or are electrically connected to, a respective word line of the vertical NAND device;
- the semiconductor substrate comprises a silicon substrate;
- the vertical NAND device comprises an array of monolithic three-dimensional NAND strings located over the silicon substrate;
- at least one memory cell in a first device level of the three-dimensional array of NAND strings is located over another memory cell in a second device level of the three-dimensional array of NAND strings;
- the silicon substrate contains an integrated circuit comprising a driver circuit for the memory device located thereon; and
- the array of monolithic three-dimensional NAND strings comprises:
  - a plurality of semiconductor channels, wherein at least one end portion of each of the plurality of semiconductor channels extends substantially perpendicular to a top surface of the semiconductor substrate;
  - a plurality of charge storage elements, each charge storage element located adjacent to a respective one of the plurality of semiconductor channels; and
  - a plurality of control gate electrodes having a strip shape extending substantially parallel to the top surface of the semiconductor substrate, the plurality of control gate electrodes comprise at least a first control gate electrode located in a first device level and a second control gate electrode located in a second device level.

15. A method of forming a semiconductor structure, comprising:
- forming peripheral devices on a semiconductor substrate;
- forming a first active alternating stack and a first peripheral alternating stack over the semiconductor substrate, wherein at least the first peripheral alternating stack overlies the peripheral devices, and each of the first active alternating stack and the first peripheral alternating stack comprises an alternating stack of first insulating layers and first spacer material layers patterned to provide respective first stepped terraces;
- forming memory openings in the first active alternating stack;
- forming memory stack structures in the memory openings in the first active alternating stack, wherein there are no memory stack structures located in the first peripheral alternating stack; and
- replacing the first spacer material layers in the first active alternating stack with first electrically conductive layers without replacing the first spacer material layers in the first peripheral stack with the electrically conductive layers;

wherein:
- the first active alternating stack of first insulating layers and first spacer material layers is patterned using a mask which exposes only a region of the respective first stepped terraces on two opposing sides of the first active alternating stack facing a portion of the peripheral devices which comprise word line decoder circuitry;
- no stepped terraces are formed on additional sides of the first active alternating stack facing a portion of the peripheral devices which comprise bit line decoder circuitry; and
- the electrically conductive layers of the first active alternating stack contact respective first spacer material layers of the first peripheral alternating stack in an area of the first active alternating stacks facing the portion of the peripheral devices which comprise the bit line decoder circuitry.

* * * * *